United States Patent
Van Zyl

(10) Patent No.: US 11,651,939 B2
(45) Date of Patent: *May 16, 2023

(54) INTER-PERIOD CONTROL SYSTEM FOR PLASMA POWER DELIVERY SYSTEM AND METHOD OF OPERATING SAME

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 104 days.

This patent is subject to a terminal disclaimer.

(21) Appl. No.: 17/220,530

(22) Filed: Apr. 1, 2021

(65) Prior Publication Data

US 2021/0249228 A1 Aug. 12, 2021

Related U.S. Application Data

(63) Continuation-in-part of application No. 17/113,088, filed on Dec. 6, 2020, now Pat. No. 11,450,510.
(Continued)

(51) Int. Cl.
*H01J 37/32* (2006.01)
*H03H 7/40* (2006.01)

(52) U.S. Cl.
CPC .. *H01J 37/32183* (2013.01); *H01J 37/32128* (2013.01); *H03H 7/40* (2013.01)

(58) Field of Classification Search
USPC .................................... 315/111.21
See application file for complete search history.

(56) References Cited

U.S. PATENT DOCUMENTS 5,325,019 A * 6/1994 Miller ............... H01J 37/32082
                                                            315/111.21
5,517,084 A    5/1996 Leung
(Continued)

FOREIGN PATENT DOCUMENTS

CN       102985996 A    3/2013
JP       S61245202 A    10/1986
(Continued)

OTHER PUBLICATIONS

First Office Action received for Chinese Patent Application Serial No. 201880045502 2 dated Oct. 11, 2021, 22 pages.
(Continued)

*Primary Examiner* — Srinivas Sathiraju
(74) *Attorney, Agent, or Firm* — Neugeboren O'Dowd PC

(57) ABSTRACT

A generator produces output such as delivered power, voltage, current, forward power etc. that follows a prescribed pattern of output versus time where the pattern repeats with a repetition period by controlling sections of the pattern based on measurements taken one or more repetition periods in the past. A variable impedance match network may control the impedance presented to a radio frequency generator while the generator produces the output that follows the prescribed pattern of output versus time where the pattern repeats with a repetition period by controlling variable impedance elements in the match during sections of the pattern based on measurements taken one or more repetition periods in the past.

20 Claims, 12 Drawing Sheets

Related U.S. Application Data which is a continuation of application No. 16/028,131, filed on Jul. 5, 2018, now Pat. No. 10,861,677.

(60) Provisional application No. 62/529,963, filed on Jul. 7, 2017.

(56) References Cited

U.S. PATENT DOCUMENTS

| | | | |
|---|---|---|---|
| 5,767,628 A | 6/1998 | Keller et al. | |
| 5,907,221 A | 5/1999 | Sato et al. | |
| 5,936,481 A | 8/1999 | Fujii | |
| 6,180,019 B1 | 1/2001 | Kazumi et al. | |
| 6,204,607 B1 | 3/2001 | Ellingboe | |
| 6,273,022 B1 | 8/2001 | Pu et al. | |
| 6,288,493 B1 | 9/2001 | Lee et al. | |
| 6,320,320 B1 | 11/2001 | Bailey, III et al. | |
| 6,388,382 B1 | 5/2002 | Doi et al. | |
| 6,463,875 B1 | 10/2002 | Chen et al. | |
| 6,507,155 B1 | 1/2003 | Barnes et al. | |
| 6,568,346 B2 | 5/2003 | Pu et al. | |
| 6,583,572 B2 | 6/2003 | Veltrop et al. | |
| 6,617,794 B2 | 9/2003 | Barnes et al. | |
| 6,633,017 B1 * | 10/2003 | Drummond | H05H 1/46 219/121.57 |
| 6,646,385 B2 | 11/2003 | Howald et al. | |
| 6,685,798 B1 | 2/2004 | Holland et al. | |
| 6,694,915 B1 | 2/2004 | Holland et al. | |
| 6,700,092 B2 * | 3/2004 | Vona, Jr. | H01J 37/32146 219/121.48 |
| 6,756,737 B2 | 6/2004 | Doi et al. | |
| 6,893,533 B2 | 5/2005 | Holland et al. | |
| 6,924,455 B1 | 8/2005 | Chen et al. | |
| 7,019,253 B2 | 3/2006 | Johnson | |
| 7,096,819 B2 | 8/2006 | Chen et al. | |
| 7,115,185 B1 * | 10/2006 | Gonzalez | H01J 37/321 315/111.41 |
| 7,732,759 B2 | 6/2010 | Chen et al. | |
| 7,839,223 B2 | 11/2010 | Van Zyl et al. | |
| 7,872,523 B2 * | 1/2011 | Sivakumar | H03F 3/2176 330/10 |
| 8,040,068 B2 | 10/2011 | Coumou et al. | |
| 8,264,154 B2 | 9/2012 | Banner et al. | |
| 8,319,436 B2 | 11/2012 | Carter et al. | |
| 8,576,013 B2 * | 11/2013 | Coumou | H03F 1/32 330/305 |
| 8,736,377 B2 * | 5/2014 | Rughoonundon | H03K 4/026 330/296 |
| 8,742,669 B2 * | 6/2014 | Carter | H01J 37/32183 315/111.71 |
| 8,773,019 B2 * | 7/2014 | Coumou | H03F 3/211 315/111.21 |
| 8,847,561 B2 | 9/2014 | Karlicek et al. | |
| 8,952,765 B2 * | 2/2015 | Fisk, II | H03B 5/1237 330/296 |
| 9,088,267 B2 * | 7/2015 | Blackburn | H03H 7/40 |
| 9,093,853 B2 * | 7/2015 | Schatz | B60L 53/126 |
| 9,210,790 B2 * | 12/2015 | Hoffman | H01J 37/3299 |
| 9,225,229 B2 * | 12/2015 | Abe | H02M 1/08 |
| 9,294,100 B2 * | 3/2016 | Van Zyl | H03L 7/26 |
| 9,355,822 B2 * | 5/2016 | Yamada | H01J 37/32155 |
| 9,478,397 B2 | 10/2016 | Blackburn et al. | |
| 9,509,266 B2 * | 11/2016 | Coumou | H03G 1/00 |
| 9,515,633 B1 * | 12/2016 | Long | H03H 7/48 |
| 9,536,713 B2 * | 1/2017 | Van Zyl | H01J 37/32935 |
| 9,544,987 B2 * | 1/2017 | Mueller | H01J 37/32146 |
| 9,595,424 B2 * | 3/2017 | Marakhtanov | H01F 38/14 |
| 9,680,217 B2 * | 6/2017 | Ali | H03H 7/40 |
| 9,773,644 B2 * | 9/2017 | Van Zyl | H03F 3/189 |
| 9,812,305 B2 * | 11/2017 | Pelleymounter | H01J 37/3405 |
| 9,852,890 B2 * | 12/2017 | Mueller | H01J 37/32174 |
| 9,947,514 B2 * | 4/2018 | Radomski | H01J 37/321 |
| 9,997,325 B2 * | 6/2018 | Hosch | H01J 37/32935 |
| 10,049,857 B2 | 8/2018 | Fisk, II et al. | |
| 10,109,460 B2 * | 10/2018 | Liu | H01J 37/32183 |
| 10,194,518 B2 * | 1/2019 | Van Zyl | H01J 37/32082 |
| 10,217,609 B2 * | 2/2019 | Fisk, II | H01J 37/3299 |
| 10,504,744 B1 * | 12/2019 | Yanagawa | H01L 21/31116 |
| 10,607,813 B2 * | 3/2020 | Fairbairn | C23C 16/509 |
| 10,741,363 B1 * | 8/2020 | Burry | H03H 7/40 |
| 10,811,228 B2 | 10/2020 | Van Zyl et al. | |
| 10,861,677 B2 * | 12/2020 | Van Zyl | H03H 7/40 |
| 10,896,807 B2 * | 1/2021 | Fairbairn | C23C 16/52 |
| 11,177,115 B2 * | 11/2021 | Leray | H01L 21/67069 |
| 2002/0185228 A1 | 12/2002 | Chen et al. | |
| 2004/0149218 A1 | 8/2004 | Collins et al. | |
| 2007/0107844 A1 * | 5/2007 | Bullock | H01J 37/32174 156/345.28 |
| 2007/0139122 A1 | 6/2007 | Nagarkatti et al. | |
| 2008/0179948 A1 * | 7/2008 | Nagarkatti | H03F 3/195 307/18 |
| 2009/0237170 A1 | 9/2009 | Van Zyl et al. | |
| 2010/0026186 A1 * | 2/2010 | Forrest | H01J 37/32935 315/111.21 |
| 2010/0171427 A1 * | 7/2010 | Kirchmeier | G01R 21/06 315/111.21 |
| 2010/0270141 A1 * | 10/2010 | Carter | H01J 37/3299 422/105 |
| 2010/0276273 A1 * | 11/2010 | Heckman | H01J 37/3299 204/298.04 |
| 2011/0248633 A1 * | 10/2011 | Nauman | C23C 14/548 315/246 |
| 2012/0252141 A1 | 10/2012 | Sundararajan et al. | |
| 2013/0002136 A1 | 1/2013 | Blackburn et al. | |
| 2013/0169359 A1 | 7/2013 | Coumou | |
| 2013/0320853 A1 * | 12/2013 | Carter | H01J 37/321 315/111.51 |
| 2014/0239813 A1 | 8/2014 | Van Zyl et al. | |
| 2014/0306754 A1 | 10/2014 | Coumou et al. | |
| 2015/0162168 A1 * | 6/2015 | Oehrlein | H01J 37/32146 216/37 |
| 2015/0250046 A1 | 9/2015 | Habu | |
| 2015/0279625 A1 | 10/2015 | Blackburn et al. | |
| 2016/0163514 A1 * | 6/2016 | Fisk, II | H01J 37/32174 315/111.21 |
| 2016/0276138 A1 | 9/2016 | Van Zyl | |
| 2017/0005533 A1 | 1/2017 | Zeine et al. | |
| 2017/0062187 A1 * | 3/2017 | Radomski | H01J 37/321 |
| 2017/0310008 A1 * | 10/2017 | White | H03H 7/40 |
| 2017/0365907 A1 * | 12/2017 | Kapoor | H03H 7/40 |
| 2018/0077788 A1 * | 3/2018 | Van Zyl | H01J 37/32935 |
| 2018/0167043 A1 * | 6/2018 | Van Zyl | H03K 17/693 |
| 2019/0013182 A1 * | 1/2019 | Van Zyl | H01J 37/32174 |
| 2019/0157040 A1 * | 5/2019 | Fairbairn | C23C 16/52 |
| 2020/0043703 A1 | 2/2020 | French et al. | |
| 2020/0203128 A1 * | 6/2020 | Fairbairn | H01J 37/3299 |
| 2020/0411289 A1 * | 12/2020 | Radomski | H01J 37/32183 |
| 2021/0118649 A1 * | 4/2021 | Huh | H01J 37/32183 |
| 2021/0118650 A1 * | 4/2021 | Van Zyl | H03H 7/40 |
| 2021/0134562 A1 * | 5/2021 | Fairbairn | C23C 16/509 |
| 2021/0166917 A1 * | 6/2021 | Van Zyl | H03H 7/40 |
| 2021/0249228 A1 * | 8/2021 | Van Zyl | H01J 37/3299 |
| 2021/0287880 A1 * | 9/2021 | Van Zyl | H01J 37/32146 |

FOREIGN PATENT DOCUMENTS

| | | |
|---|---|---|
| JP | H06243992 | 9/1994 |
| JP | 11087097 A | 3/1999 |
| JP | 2002184598 A | 6/2002 |
| JP | 2004085446 A | 3/2004 |
| JP | 2005527078 A | 9/2005 |
| JP | 2005534187 A | 11/2005 |
| JP | 2006286254 A | 10/2006 |
| JP | 2007311182 A | 11/2007 |
| JP | 2007336148 A | 12/2007 |
| JP | 2008501224 A | 1/2008 |
| JP | 2008-157906 A | 7/2008 |
| JP | 2009514176 A | 4/2009 |
| JP | 2010521041 A | 6/2010 |
| JP | 2010219026 A | 9/2010 |
| JP | 2011-519115 A | 6/2011 |
| JP | 2013176040 A | 9/2013 |
| KR | 10-2014-0000172 A | 1/2014 |

(56) References Cited

FOREIGN PATENT DOCUMENTS

| KR | 10-2014-0130009 | A  | 11/2014 |
|----|-----------------|----|---------|
| TW | I562189         | B  | 12/2016 |
| TW | 201719711       | A  | 6/2017  |
| TW | I585814         | B  | 6/2017  |
| WO | 2004012220      | A2 | 2/2004  |
| WO | 2019/010312     | A1 | 1/2019  |

OTHER PUBLICATIONS

International Search Report and Written Opinion received for International PCT Application Serial No. PCT/JS2022/016291 dated Apr. 27, 2022, 11 pages.
Leva et al., "Periodic Event-based Control with Past Measurements Transmission", IEEE, 2017, 8 pages.
Notice of Grounds for Rejection received for Korean Patent Application Serial No. 10-2022-7004931 dated Mar. 22, 2022, 18 pages.
Remy, Jerome, "Supplemental Extended Search Report Regarding European Patent Application No. 18827671.1", dated Feb. 9, 2021, pp. 10, Published in: EP.
Japanese Patent Office, "Office Action Issued in Japanese Patent Application No. 2020-500181", dated Feb. 2, 2021, Published in: JP.
TIPO, "Official Action From the Intellectual Property Office of Taiwan Regarding Application No. 107123277", dated Jul. 8, 2020, pp. 19, Published in: TW.
Sathiraju, Srinivas, "Final Office Action Regarding U.S. Appl. No. 16/028,131", dated Mar. 10, 2020, pp. 36, Published in: US.
Sathiraju, Srinivas, "Office Action Regarding U.S. Appl. No. 16/028,131", dated May 31, 2019, pp. 29, Published in: US.
Sathiraju, Srinivas, "Office Action Regarding U.S. Appl. No. 16/028,131", dated Oct. 4, 2019, pp. 27, Published in: US.
Sathirajui, Srinivas, "Office Action Regarding U.S. Appl. No. 16/028,131", dated Nov. 20, 2018, pp. 24, Published in: US.
Thomas, Shane, "International Search Report and Written Opinion Regarding International Application No. PCT/US2018/040930", dated Nov. 1, 2018, pp. 15, Published in: US.
International Preliminary Report on Patentability received for International PCT Application Serial No. PCT/JS2012/020219 dated Jul. 18, 2013, 7 pages.
International Search Report and Written Opinion received for International PCT Application Serial No. PCT/JS2012/020219 dated Feb. 22, 2012, 9 pages.
International Search Report and Written Opinion received for International PCT Application Serial No. PCT/JS2022/014915 dated Mar. 21, 2022, 11 pages.
Maurice, C. Y. M., "Inductively Coupled Plasmas: Ion Dynamics and Interactions with Bone Tissue", Technische Universiteit Eindhoven, pp. 203, 2003.

Non-Final Office Action received for U.S. Appl. No. 14/740,955 dated Feb. 2, 2016, 16 pages.
Non-Final Office Action received for U.S. Appl. No. 17/113,088 dated Dec. 13, 2021, 49 pages.
Notice of Allowance received for U.S. Appl. No. 14/740,955 dated Jun. 22, 2016, 12 pages.
Notice of Allowance received for U.S. Appl. No. 14/740,955 dated May 6, 2016, 16 pages.
Notice of Allowance received for U.S. Appl. No. 16/028,131 dated Aug. 3, 2020, 31 pages.
Notice of Allowance received for U.S. Appl. No. 16/028,131 dated Aug. 27, 2020, 17 pages.
Office Action received for Japanese Patent Application Serial No. 2013547731 dated Jul. 28, 2015, 13 pages Including English Translation).
Office Action received for Japanese Patent Application Serial No. 2013547731 dated Mar. 3, 2016, 2 pages.
Office Action received for Japanese Patent Application Serial No. 2013547731 dated Nov. 27, 2015, 7 pages Including English Translation).
Office Action received for Japanese Patent Application Serial No. 2013547731 dated Sep. 30, 2014, 8 pages Including English Translation).
Office Action received for Korean Patent Application Serial No. 10-2013-7019332 dated Jan. 20, 2016, 6 pages (Including English Translation).
Office Action received for Korean Patent Application Serial No. 10-2013-7019332 dated May 29, 2015, 16 pages (Including English Translation).
Petition Claiming support for Claim Amendments re Application Serial No. 201653392 dated May 10, 2016, 10 pages (Including English Translation).
Response to Office Action for Japanese Patent Application Serial No. 2013547731 filed on Mar. 17, 2016, 7 pages (Including English Translation).
Response to Office Action for Korean Patent Application Serial No. 10-20137019332 filed on Jul. 22, 2015, 22 pages.
KIPO, "Notice of Grounds for Rejection Regarding Korean Patent Application No. 10-2020-7001574", dated May 14, 2021, pp. 18, Published in: KR.
International Search Report and Written Opinion received for International PCT Application Serial No. PCT/US2022/016291 dated Apr. 27, 2022, 11 pages.
WO 2019/010312 A1 (Advanced Energy Industries, Inc.) Jan. 10, 2019.
A. Leva, F. Terraneo and S. Seva, "Periodic event-based control with past measurements transmission," 2017 3rd International Conference on Event-Based Control, Communication and Signal Processing (EBCCSP), 2017, pp. 1-8, doi: 10.1109/EBCCSP.2017.8022830.

* cited by examiner

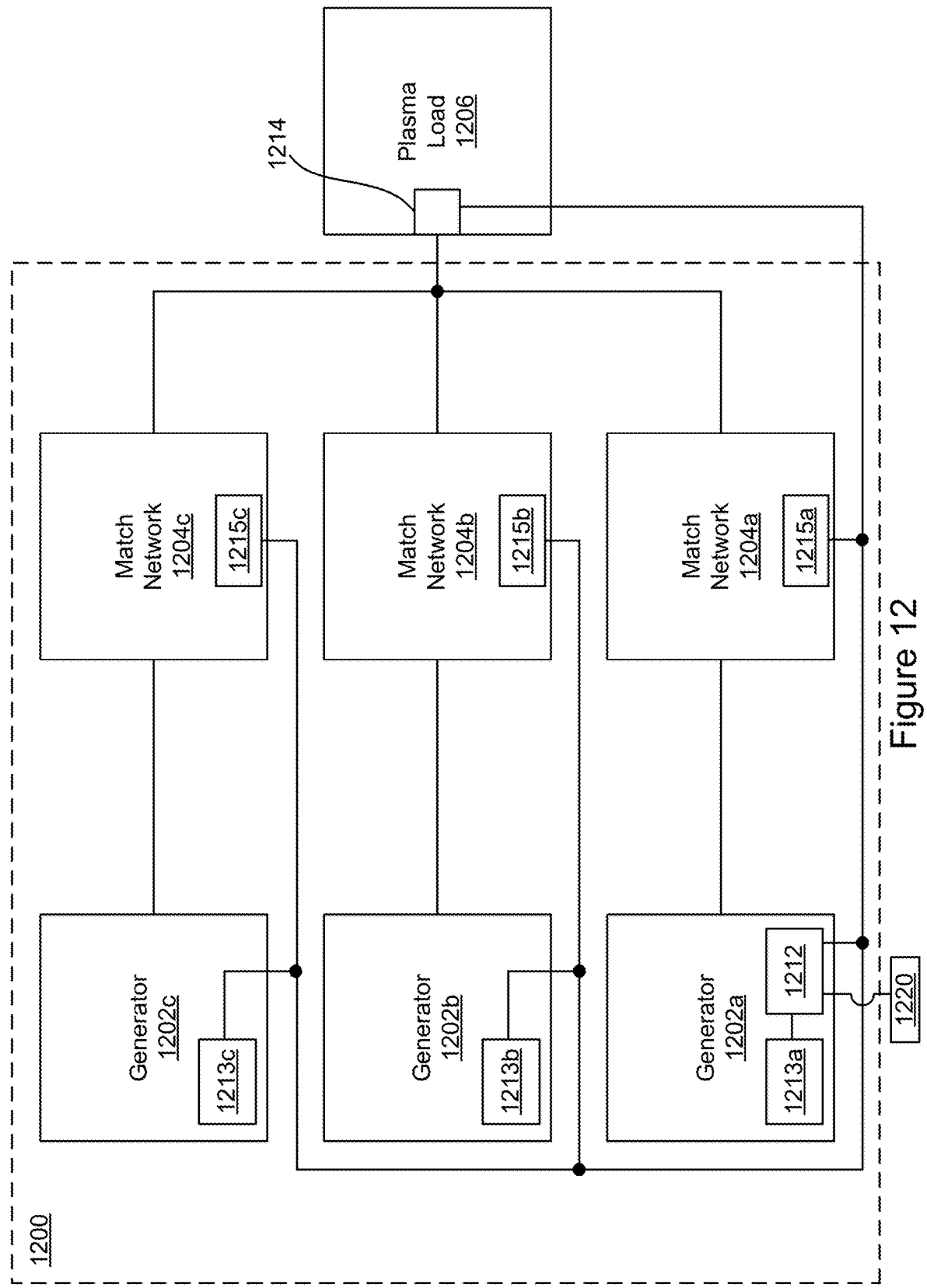

INTER-PERIOD CONTROL SYSTEM FOR PLASMA POWER DELIVERY SYSTEM AND METHOD OF OPERATING SAME

CLAIM OF PRIORITY UNDER 35 U.S.C. § 120

The present Application for Patent is a Continuation-in-Part of patent application Ser. No. 17/113,088 entitled "INTER-PERIOD CONTROL SYSTEM FOR PLASMA POWER DELIVERY SYSTEM AND METHOD OF OPERATING THE SAME," filed Dec. 6, 2020, pending, which is a Continuation of patent application Ser. No. 16/028,131 entitled "INTER-PERIOD CONTROL SYSTEM FOR PLASMA POWER DELIVERY SYSTEM AND METHOD OF OPERATING THE SAME," filed Jul. 5, 2018, and issued as U.S. Pat. No. 10,861,677, on Dec. 8, 2020, which claims priority under 35 U.S.C. § 119(e) from U.S. Patent Application No. 62/529,963, filed Jul. 7, 2017 entitled "INTER-PERIOD CONTROL SYSTEM FOR PLASMA POWER DELIVERY SYSTEM AND METHOD OF OPERATING THE SAME," the entire contents of which is incorporated herein by reference for all purposes. These applications and patents are assigned to the assignee hereof and hereby expressly incorporated by reference.

TECHNICAL FIELD

Aspects of the present disclosure relate to improved methods and systems for controlling a power delivery system, and particularly for controlling a plasma power delivery system.

BACKGROUND

A drive for ever shrinking chip features poses significant challenges for the semiconductor industry. Requirements such as reduced plasma damage, thinner layers, shorter processing times, etc. demand higher sophistication in tool and process development. As an example, significant advances in etch processes have been enabled by multi-generator synchronized pulsing.

Chips are often fabricated via plasma processing systems that deposit thin films on a substrate using processes such as chemical vapor deposition (CVD) and physical vapor deposition (PVD) as well to remove films from the substrate using etch processes. The plasma is often created by coupling radio frequency (RF) or direct current (DC) generators to a plasma chamber filled with gases injected into the plasma chamber at low pressure. Typically, a generator delivers RF power to an antenna in the plasma chamber, and power delivered at the antenna ignites and sustains a plasma. In some instances, the RF generator is coupled to an impedance matching network that may match the plasma impedance to a desired impedance, typically 50Ω, at the generator output. DC power is typically coupled to chamber via one or more electrodes. The generator alone or the generator in combination with other pieces of equipment, such as the impedance matching network, other generators coupled to the same plasma, cables, etc., constitute a plasma power delivery system.

Modulation of the power delivered to the plasma system is often required. Most modulation schemes are repetitive, i.e., the same modulation waveform is repeated at a waveform repetition rate. The associated waveform repetition period is equal to one divided by the waveform repetition rate. The ability to follow a prescribed modulation waveform using a traditional control scheme requires high bandwidth from the controller and ultimately from the measurement system. Many plasma systems have power applied to the plasma at different frequencies. The nonlinear nature of the plasma load creates intermodulation products that can interfere with a generator's measurements system. Thus, it is sometimes advantageous to use a narrowband measurement system to limit such interference. In many applications, power delivered to the plasma load is not the only parameter that is being controlled. For example, in RF power delivery systems, the impedance presented to the generator by the plasma load can be controlled, either through controlling the frequency of the generator output or through controlling a variable impedance match network between the generator and the plasma load. In some cases, generator source impedance may also be controlled. Tracking and controlling power in light of these various issues presents ever greater control challenges.

Additionally, a human operator typically monitors multiple sensor outputs from a generator and a match network and adjusts numerous parameters in an imperfect and relatively slow attempt to maintain consistent power delivery to the plasma load. The operator may interact with an external controller that collects information from the various components of the system, displays this information for the operator, and transmits commands from the operator to the various components of the system. Although this configuration has worked in the past, it is increasingly apparent that it may not be adequate for current systems.

As an example, major advances in etch processes have been enabled by the introduction of a generation of RF power supplies with advanced capabilities, including generator frequency tuning while pulsing and multi-generator synchronized pulsing. Yet, independent control of these different components can still hold back current systems. In particular, while the generator provides pulsed power with a tunable frequency, the match network has difficulty detecting, measuring, and responding to the pulsed signal and thus has difficulty taking advantage of the generator's capabilities. Operators tend to select an optimal variable capacitor position inside the match network and then run the process—a suboptimal solution for minimizing real time power reflection.

It is with these observations in mind, among others, that aspects of the present disclosure were conceived.

SUMMARY

According to one embodiment, a generator produces output such as delivered power, voltage, current, forward power etc. that follows a prescribed pattern of output versus time where the pattern repeats with a repetition period by controlling sections of the pattern based on measurements taken one or more repetition periods in the past. In one example, a power delivery system involves a generator that produces a repeating output pattern and a control element controls the repeating pattern based on a measurement of a value of the repeating pattern taken a period prior to a current period. The control element may further control the repeating output pattern based on the measurement of the repeating pattern taken a period prior to the current repetition period combined with a measurement of a value of the repeating pattern during a current repetition period. The repeating output pattern may follow a prescribed pattern of output versus time wherein the prescribed pattern repeats with a repetition period, and wherein the measurement of the value of the repeating pattern taken a period prior to the current period occurs one or more repetition periods in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past. The generator may provide the delivered power, voltage, current, forward power, etc., to a plasma system in order to ignite and sustain a plasma, in various possible embodiments.

According to yet another embodiment, a generator produces output that follows a prescribed pattern of output versus time where the pattern repeats with a repetition period by controlling sections of the pattern based on measurements taken one or more repetition periods in the past; and combining this controller with an intra-period controller that calculates the control output based on measurements taken less than a repetition period in the past.

According to yet another embodiment, a variable impedance match network controls the impedance presented to a RF generator while the generator produces output, such as delivered power, voltage, current, forward power, etc., that follows a prescribed pattern of output versus time where the pattern repeats with a repetition period by controlling variable impedance elements in the match during sections of the pattern based on measurements taken one or more repetition periods in the past; and combining this controller with an intra-period controller that calculates the control of the variable impedance elements in the match based on measurements taken less than a repetition period in the past.

According to another embodiment, a generator produces output that follows a prescribed pattern of output versus time where the pattern repeats with a repetition period by controlling sections of the pattern based on measurements taken one or more repetition periods in the past while at the same time adjusting another parameter such as generator output frequency or variable impedance elements contained in the generator or in a variable impedance matching network coupled between the generator and the plasma based on measurements taken one or more repetition periods in the past where the correlation between the control inputs such as power control and generator frequency and control outputs such as delivered power and impedance presented to the generator is determined and used by the control system.

According to yet another embodiment, a generator produces output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

BRIEF DESCRIPTION OF THE DRAWINGS

The various features and advantages of the technology of the present disclosure will be apparent from the following description of particular embodiments of those technologies, as illustrated in the accompanying drawings. It should be noted that the drawings are not necessarily to scale; however the emphasis instead is being placed on illustrating the principles of the technological concepts. Also, in the drawings the like reference characters may refer to the same parts throughout the different views. The drawings depict only typical embodiments of the present disclosure and, therefore, are not to be considered limiting in scope.

FIG. 12 illustrates yet another embodiment of a multi-generator power delivery system.

DETAILED DESCRIPTION

Figure 1A:
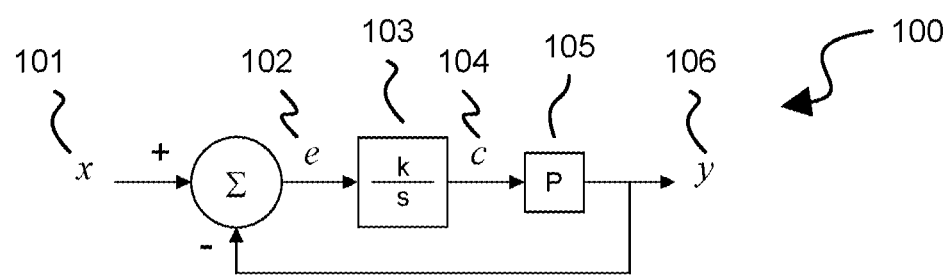
FIG. 1A illustrates a simple analog intra-period.

Embodiments of the present disclosure provide a plasma power delivery system that produces an output, such as delivered power, voltage, current, and forward power, that follows a prescribed pattern of output versus time where the pattern repeats with a repetition period by controlling sections of the pattern based on measurements taken one or more repetition periods in the past as opposed to within the current period. Compared to a conventional controller, such an inter-period controller can reproduce output more accurately utilizing a lower bandwidth measurement and control system. The benefits provided by the inter-period controller can be advantageous in various contexts including in the presence of plasma generated mixing and intermodulation products. In additional embodiments, the inter-period controller can be combined with a conventional intra-period controller. In additional embodiments, parameters, such as generator output frequency, pulse width, and match impedance, may be adjusted together with the main output based on measurements taken one or more repetition periods in the past where the correlation between the control inputs, such as power control, generator frequency, and match variable element settings, and control outputs, such as delivered power and impedance presented to the generator are determined and used by the control system. In additional embodiments, a generator produces an output that follows a prescribed pattern of output versus time where the pattern repeats with a repetition period by controlling a section of the pattern based on measurements taken for the same section one or more repetition periods in the past; as well as such measurements for other sections in the pattern by perturbing the control input, determining the response to the perturbation, and using the response to the perturbation to compensate for coupling between adjacent or closely located time periods in the waveform.

While primarily described with reference to a controller for a generator, aspects of the present disclosure are applicable to switch mode power supplies, and controllers for the same, which may be used in eV source applications such as to provide a bias to a substrate as part of an overall power delivery system, as well as other substrate biasing schemes. The controller and control schemes discussed herein may also be used to control variable impedance elements (such as vacuum variable capacitors or switched variable reactance elements) of impedance matching networks. In such instances, aspects of the present disclosure may or may not also be used in the controlling of an RF supply to the impedance matching network as part of the overall power delivery system. The controller may reside in any part of the power delivery system (e.g., in the generator or in the matching network) and may or may not receive information from and control other parts of the power delivery system. For example, a controller residing in the generator may control both a generator power signal and a match that are part of the power delivery system with information obtained only from the generator, only from the match or from both the generator and the match. The controller and control schemes discussed herein may also be used in other systems with or without delivering power in a plasma power delivery environment. In some novel embodiments, a sensor that the controller bases its decisions on, as well as the controller can both be arranged in the generator.

Figure 1B:
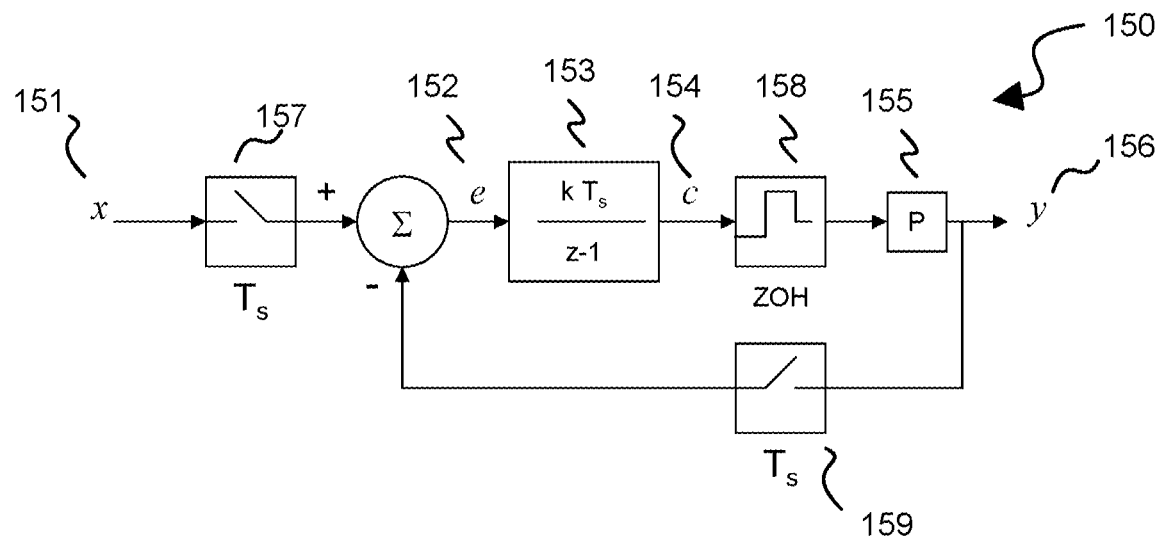
FIG. 1B illustrates a simple digital intra-period control systems that may be used to control a plasma power delivery system.

FIG. 1A (prior art) illustrates a simple analog intra-period, and FIG. 1B (prior art) illustrates a simple digital intra-period control systems that may be used to control a plasma power delivery system. In FIG. 1A the difference between an input 101 and output 106 produces an error signal 102 that a controller 103 uses to produce a control input 104 to a plant 105. In this illustration, the controller is a simple integrator with a gain of k. In an actual implementation, the control input 104, c, may be a drive level to a power amplifier, and the plant 105, P, a power amplifier. To illustrate the performance differences between this controller and the disclosed inter-period controller, the plant 105, P, is a unity gain block, i.e. y=c. With these assumptions, the loop gain has unity gain at k rad/s or $k/(2\pi)$ Hz, the time constant of the system step response is $1/k$ s and the integral of the impulse response of the system reaches 63.2% $(1-1/e)$ in $1/k$ s. In FIG. 1B, an input 151 is sampled at a sampling rate of $1/T_s$ and digitized by a sampler 157. (In some applications the input is already a digital data stream and the sampler 157 is not present in the system.) The output 156 is sampled and digitized by a sampler 159 and the difference between the input and output produces an error signal 152 that a controller 153 uses to produce a control input 154 which is converted to an analog control signal by a digital to analog converter 158 which is fed to a plant 155. As for FIG. 1A, to illustrate the performance differences between this controller and the disclosed inter-period controller, the plant 105, P, is a unity gain block. The same statements regarding relationship between k and the unity gain frequency and response times hold as for the analog controller of FIG. 1A provided that k is much less than $2\pi/T_s$.

Figure 2A:
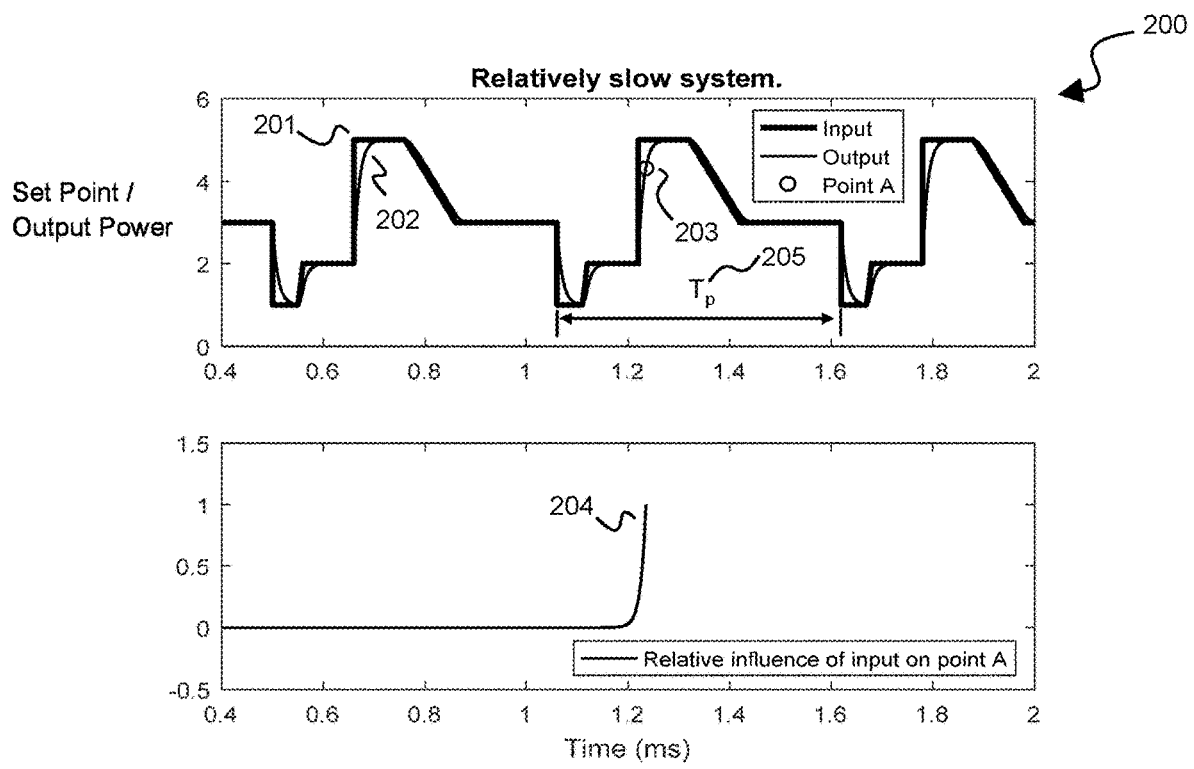
FIG. 2A illustrates the response of a relatively slow intra-period control system to a periodic input and FIG. 2B illustrates the response of a relatively fast intra-period control system to a periodic input.
Figure 2B:
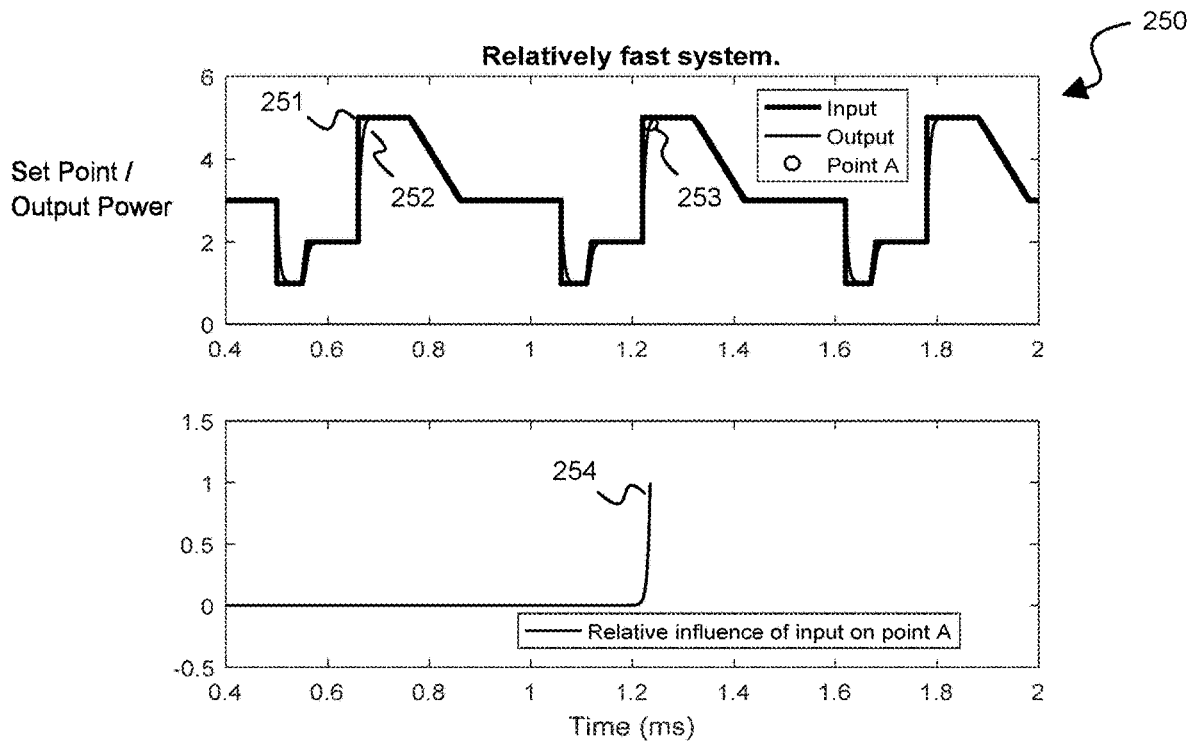

FIG. 2A (prior art) shows the response 200 of the simple intra-period controller such as shown in FIG. 1A or FIG. 1B to a periodic input with period $T_p$, 205. In this example a host of different set points (e.g., a set point power of 1, followed by 2, followed by 5, with a ramp to 3) defines one period of the input. The output, 202, follows the input, 201 with visible inaccuracy (where the output does not match the input set point). The time constant of the closed loop response for this illustration is 10 μs. The output at a given point, A, 203, can be obtained by multiplying the time shifted time reversed impulse response of the system with the input and integrating. The normalized time shifted time reversed impulse response of the unit, 204, shows that the output at point A, 203, is heavily influenced by the very recent past (within one time constant or 10 μs prior to point A), and almost not at all by events occurring earlier than 10 time constants prior to point A. To accommodate the changing set points within a pulse, the conventional controller must be very fast. As shown in FIG. 2B (prior art), speeding up the controller improves the ability of the output to follow the input accurately. The time constant of the closed loop response for this illustration is 5 μs. The response, 250, shows that the output, 252, follows the input, 251, more closely. The normalized time shifted time reversed impulse response 254 shows that the point A, 253, is now even more heavily influenced by the input in the very recent past.

In these conventional intra-period controllers, the error control is based on the measured value of the current output (within the period) against the set point. So, referring to FIG. 2A, for example, the measured value of the output at time 1.5 ms would be compared against the set point value at that same time to generate the error signal. Stated differently, the set point values are compared against the measured values during the current period to generate the error signal for the conventional intra-period controller. In contrast, an inter-period controller compares the measured value of the output one or more cycles in the past for a given set point and uses the past measured value at the set point to generate the current error signal and controller output. Referring again to FIG. 2A, for example, at time 1.5 ms with a set point of 3, the measured value at time 0.94 ms (which is one waveform repetition period of 0.56 ms earlier or that part of the preceding pulse that correlates with time 1.5 ms) with the same set point of 3 would be used by the controller to generate the error and output, as opposed to the measured value within the pulse at time 1.5 ms. Notably, the inter-period controller need not be nearly as fast because it relies on a measured value one cycle in the past as opposed to an immediately proximate value within the pulse.

In some examples, the pulse (e.g., the pulse over period Tp) is divided into multiple time periods, and the corresponding (same) output value in the same time period of the previous pulse is used for the error signal. Referring again to the example immediately above referring to using the measured value at time 0.94 ms of the first pulse for the error correction at time 1.5 ms of the following second pulse, the time period would encompass the specific value of 0.56 ms within some range. In one example, the time periods by which pulses are divided are such that any given time period does not encompass different set points, with the exception of sloped set point transitions.

In various implementations, the inter-period pulse information is stored in some form of memory such that it can be accessed and used by the controller for the error feedback of the succeeding pulse. Complicated pulses, such as with sloped set point transitions, and otherwise different set points may benefit from relatively smaller time period subdivisions of the pulse, and therefore may require relatively larger and faster memory. In specific examples, pulses with between a 100 ms and 10 µs period $T_p$ may be subdivided into 1024 time slices, and output values for each slice stored for comparison to the measured value in the same time slice of the subsequent pulse.

In some applications no error signal is generated. In impedance matching applications using an inter-period control scheme information about an impedance presented to a generator one or multiple periods, $T_p$, 205, in the past can be used to adjust variable impedance elements within the matching network at the present time. The information can be used to calculate adjustments to the variable impedance matching elements without first generating an error signal. In impedance matching applications the setpoint (e.g. 101, 151, 303, 351, 501) is generally constant, but there is a periodic disturbance of the load impedance that must be matched to a desired input impedance. Such a periodic disturbance can for example arise from delivering power to a plasma load that follows a prescribed pattern of output versus time where the pattern repeats with a repetition period. In such a case a synchronization signal from for example the power source providing the prescribed pattern of power can be provided to the matching network to assist the matching network in synchronizing with the repetitive waveform of the disturbance. In other impedance matching applications, simultaneous control of the generator power signal and variable impedance elements within the matching network can be adjusted via an inter-period control scheme and a single controller, optionally arranged at the generator. This scheme may be based on measurements from a sensor arranged at the generator, at the match network, or therebetween, and the controller may optionally be arranged in the generator.

Figure 3A:
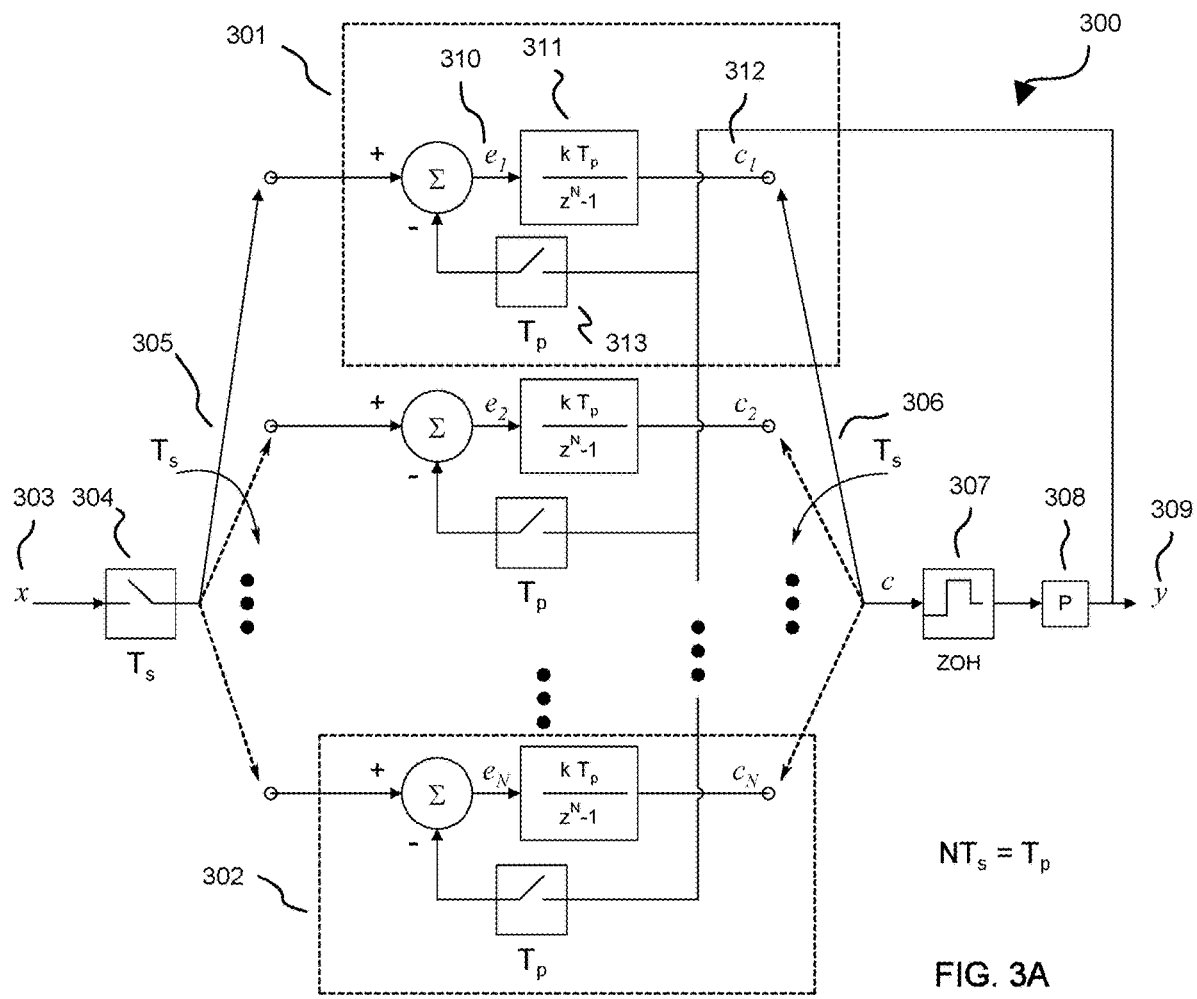
FIG. 3A and FIG. 3B illustrate block diagrams of example inter-period controllers that may be implemented in a plasma power delivery system according to embodiments of the present disclosure.
Figure 3B:
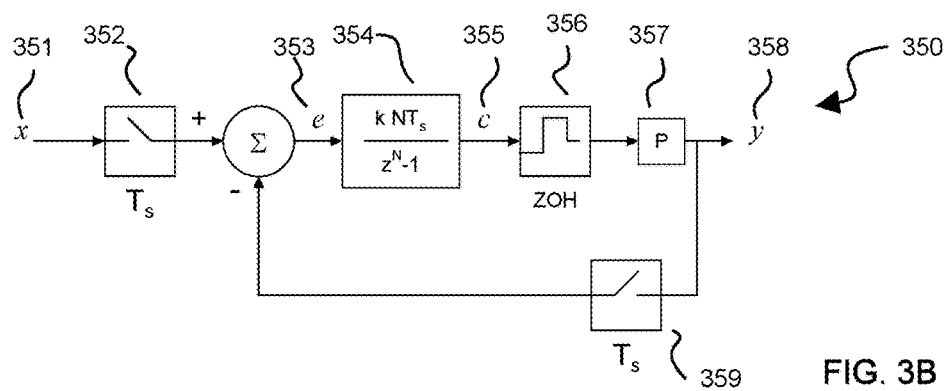

FIG. 3A illustrates a block diagram of one example of an inter-period controller 300 that may be implemented in a plasma power delivery system according to one embodiment of the present disclosure. FIG. 3B illustrates a block diagram of an alternate example implementation of an inter-period controller 350 that may be implemented in a plasma power delivery system according to another embodiment of the present disclosure. Some implementations of the inter-period controllers described herein may be considered multi-input-multi-output (MIMO) controllers. The controllers or more generally control elements may be implemented in hardware and software, with various possible combinations of the same. The control element may be integrated with the generator or other device, or may be a separate component. In some applications the inter-period controller may reside in a different piece of equipment from what is being controlled. As an example, a controller connected to an impedance matching network may reside in the generator but control the generator power signal and the variable impedance elements in the impedance matching network. In such an application forward and reflected signals from a sensor such as a coupler may be obtained from a coupler residing in the generator, filtered in analog, digitized in an analog to digital converter, and processed to extract the impedance presented to the generator by the match by a microprocessor running a software program or by digital logic circuits implemented in, for example, an FPGA. The measurements can be stored in memory by a microprocessor or reconfigurable digital circuits residing in an FPGA. The memory containing samples of impedance measurements at different times can be processed using software running in a microprocessor or by an FPGA. The software or FPGA can use samples one or multiple waveform repetition periods in the past to implement an inter-period control scheme. To implement such a scheme information about past values of variable impedance elements in the match can also be used. The controller can then send control signals to the match to change variable impedance elements in the match and optionally simultaneously control the generator. The inter-period controller may also work with the sensor, for instance, by providing information about a start of a pulse or a start of a rapid power swing in the generator to the sensor, before such an event takes place. In this way, the sensor can predictively know when to begin sampling, and thus operate more quickly than prior art sensors that might have started sampling only after a pulse is identified or a rapid swing in power is first identified. For impedance measurements, the controller can control the generator frequency and provide this frequency preemptively to the sensor allowing more rapid assessment of impedance seen by the generator than traditional sensors since those sensors often first measure frequency before measuring impedance.

FIG. 3A implements the inter-period controller (providing an interleaved scheme) as a number, N, of controllers each running at the repetition period, $T_p$, of the input. The block 301 shows the first such controller and the block 302 shows the N-th such controller. The input, 303, is sampled and digitized by an analog to digital converter, 304, at a sampling rate of $1/T_s$. (The input may already exist as a data stream in which case the converter 304 is not used.) The sampled input is switched or routed to the controllers in turn by a switch, 305 so that each controller receives an updated input at a rate of $1/T_p$. The outputs of the controllers are routed to a common control input, c, by a switch 306. The control input is converted to analog by a digital to analog converter 307 and applied to the control input of a plant, P, 308. The output, y, 309, is sampled by each controller at a rate of $1/T_p$ by a sampler (313 for controller 301).

Each controller creates an error function (310 for controller 301) by subtracting the input from the sampled output. (Since the sampled output is delayed by a waveform period, $T_p$, this implements an inter-period controller.) The error function is integrated (by 311 for controller 301) producing an output (312 for controller 301). The number of controllers, N, and the sampling period $T_s$ is adjusted so that $NT_s=T_p$. To cater for situations where the repetition period of the input, $T_p$, may vary a few sampling periods, extra controllers may be utilized. For example, there may be N+3 controllers to deal with a $T_p$ that can vary three sampling periods. When an extra control section is not updated due to a shorter than maximum $T_p$, the state of the last updated controller can be copied to the extra control section.

FIG. 3B shows an alternate implementation of an inter-period controller 350 in accordance with an embodiment of the present disclosure. The input 351 is sampled and digitized by an analog to digital converter, 352, at a sampling rate of $1/T_s$. (The input may already exist as a data stream in which case the converter 352 is not used.) The output 358 is sampled and digitized by an analog to digital converter 359. (The output may be a digital data stream derived from a measurement of the output in which case the analog to digital converter may not be implemented as shown.) An error function 353 is obtained by subtracting the input from the output. The controller 354 generates the control input to the plant, c, 355, from the values of the control input to the plant, c, 355, and the error function, e, 353, one period of the input, $T_p$ ago. This is significantly different from a conventional intra-period controller as will be shown infra. The control input to the plant is converted to an analog signal by a digital to analog converter, 356, and applied to a plant, 357. As for the controller 300, provision can be made to deal with situations where the repetition period of the input, $T_p$, may vary a few sampling periods. In this case, N is allowed to vary based on the number of sampling periods $T_s$ that fit in the previous period of the input $T_p$.

The herein-disclosed inter-period controller, for instance, sending a synchronization signal from the power source to the matching network, or an inter-period controller that simultaneously tunes the generator and the match network, has a number of advantages over the prior art. First, by unifying control and operation of various components of a power delivery system, novel power delivery methods are enabled, such as the ability to simultaneously tune a match network and a generator (e.g., via control signal 306, 355, 506, or the input to 905) or tune the match network while pulsing or changing the waveform of the generator output (e.g., via control signal 306, 355, 506, or the input to 905). For instance, the herein-disclosed plants can be a generator, a match network, or both a generator and match network (where the control signal is actually two distinct signals—one for each of the generator and the match network). Second, this system and approach enables rapidly-adjustable, accurate, and consistent power delivery to a plasma load. The speed of a power delivery system using the herein-disclosed inter-period controller is particularly useful in dynamic power applications (e.g., pulsed generator output).

The ability to more rapidly adjust power delivery and impedance matching can also be attributed to avoidance of delays that traditional systems see when sensors must first measure frequency before measuring impedance. The inter-period controller can provide the sensor with operating parameters of the generator (e.g., any of the plants disclosed herein), such as frequency, so that the sensor need not measure frequency before beginning to sample for impedance. Earlier sampling means that impedance can be determined faster than in the art. The inter-period controller can also provide the sensor with an indication of the start of pulsing or a change in a power waveform, thus preventing the sensor from having to detect such a change before sampling begins. This also enables the sensor to begin measuring impedance sooner than sensors in the art.

The inter-period controller also improves the accuracy of power delivery in four ways. First, when multiple sensors are used to measure power and impedance each sensor has an error function associated with that sensor resulting from calibrations that are made to each sensor. By using a single sensor to measure power and impedance, only a single calibration is performed, and therefore less error is introduced.

Second, earlier sampling leads to a greater number of sampling points, which can improve impedance measurements. In the art, sampling typically begins after a pulse or change in the generator waveform has been detected, whereas here, the inter-period controller indicates to the sensor a start of a pulse or change in the generator waveform before or when the pulse or waveform change occurs. As such, the sensor can begin sampling earlier than is possible in the art, thus enabling more accurate impedance measurements.

Third, a measure of impedance depends on the frequency of the signal being measured, and thus errors in measuring frequency translate to errors in the impedance that is measured. Prior art impedance measurements are often made after a sensor in the match network measures frequency, thus introducing unnecessary error. Alternatively, when using a broadband sensor, error is introduced by analog variation in the broadband sensor as a function of frequency. By the inter-period controller making the sensor aware of the frequency that the generator is producing, rather than requiring the sensor to measure the frequency at the match network, the first sensor sees less error in impedance measurements than sensors in the prior art. Also, because the sensor does not have to measure frequency, it can take more samples, and a larger sample size improves accuracy.

Fourth, the inter-period controller can take component variations into account by identification of the components to the inter-period controller. For instance, the generator, match network, and sensor can identify themselves to the inter-period controller via brand, model, serial number or other identifying information. Also, they can provide operating characteristics such as status, set point, and configuration, to name a few. Authentication may take place via an authentication algorithm. As such, in one embodiment, only specific types or brands of generator and match network are operable when connected via a transmission medium. The inter-period controller can also query the generator, the match network, and the sensor to determine their unit type, serial number, part number, or any other identifying information. With this knowledge, the inter-period controller can tailor instructions to the generator and the match network to account for variations in components, thus allowing the inter-period controller to effect more accurate and consistent power delivery than is possible in the art.

The inter-period controller also improves the consistency (or quality) of power delivery because of the ability to measure both power and impedance. In part, consistency is improved via the greater accuracy described above (e.g., decreased error stack-up and earlier and more extensive sampling). Consistency is also improved, because, where the prior art had difficulty maintaining stability in multiple control loops of a power delivery system, the single inter-period controller can control the multiple control loops and ensure stability and synchronization between the control loops.

In some embodiments the inter-period controller benefits from use with a single sensor to monitor both power output of the generator and an impedance seen by the generator. The sensor can measure voltage, current, phase, impedance, and power at an output of the generator. The sensor can be arranged at an output of the generator. The sensor can measure impedance seen by the generator in addition to power from the generator because of the ability to remotely measure impedance. Remote impedance measurements look at impedance at a location physically remote from the sensor. This is made possible by (1) the sensor having a more linear response with respect to increasing voltage standing wave ratio referenced to a calibration impedance than sensors in the art, and (2) the sensor can more closely measure a phase of the generator output power.

Typically, sensors can be calibrated to operate optimally close to a center operating impedance (e.g., 50Ω), but due to their nonlinear response to impedance variations, as impedance moves away from the calibration impedance, sensor accuracy degrades rapidly. This inaccuracy for physically local measurements is amplified when making measurements over large physical distances. In contrast, the herein-disclosed sensor has a more linear response on the voltage standing wave ratio circle, which enables accurate impedance measurements at impedances far from the impedance calibration point and therefore at physically remote locations.

In addition, the sensor can more closely measure a phase of the generator output than could prior generations of sensors. In particular, at high phase angles there is extreme sensitivity to phase angle measurement accuracy, and thus in the resulting impedance and power measurements. Since the sensor can more accurately measure phase angle, it is better able to remotely measure impedance.

In an embodiment, the sensor is a directional coupler. A directional coupler can measure the scaled power of forward and reverse power as well as the phase difference between them. The directional coupler can then pass the scaled power and phase difference back to the inter-period controller. Scaled power is a voltage that the directional coupler provides to a measurement system that is proportional to an output voltage of the generator operating into its nominal load condition (e.g., 50Ω).

Because the inter-period controller manages operation of both the generator and the match network, simultaneous tuning of those components is possible. The inter-period controller can instruct the generator to adjust an amplitude, carrier frequency, power frequency, pulse width, pulse duty cycle, or waveform of the generator power output. The inter-period controller can also instruct the match network to adjust an impedance of the match network, for instance by having a motor drive board adjust variable capacitors of the match network.

Available tuning options can dictate how the inter-period controller manages the power delivery system. Where the generator frequency is fixed, the inter-period controller can pass instructions to the match network to adjust impedance. Where the generator frequency is variable, the inter-period controller can (1) pass instructions to the match network to alter the impedance that the generator sees, (2) pass instructions to the generator to alter the power output frequency, or (3) pass instructions to the match network to alter the impedance that the generator sees and pass instructions to the generator to alter its power output frequency. Since the generator frequency is more quickly adjusted than the impedance of the match network, instructing the generator to tune via frequency in addition to or instead of the match network adjusting impedance, can be preferable where fast tuning is required. In other words, impedance matching can be performed via the inter-period controller's simultaneous tuning of the generator and the match network.

The inter-period controller can also take into account non-electrical characteristics of the plasma load when managing operations of the generator and the match network. For instance, the inter-period controller can consider chamber pressure, gas chemistry in the chamber, ion energy of the plasma, light intensity of the plasma, spectral content of light emitted by the plasma, and plasma arcing to name a few non-limiting examples. In an embodiment, an optional second sensor can monitor non-electrical characteristics of the plasma load or the plasma processing chamber (not illustrated), such as chamber pressure, gas chemistry in the chamber, ion energy of the plasma, light intensity of the plasma, spectral content of light emitted by the plasma, and plasma arcing, to name a few non-limiting examples.

Figure 4A:
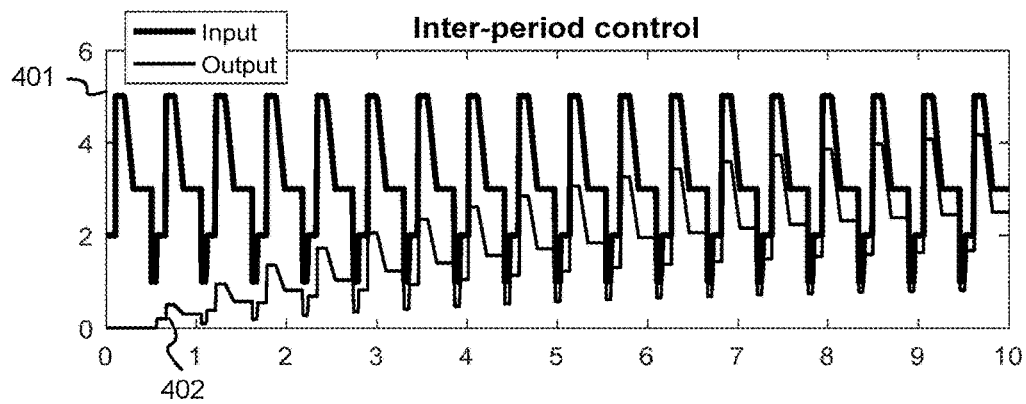
FIG. 4A-FIG. 4D illustrate the response of an example inter-period controller to a periodic input.
Figure 4B:
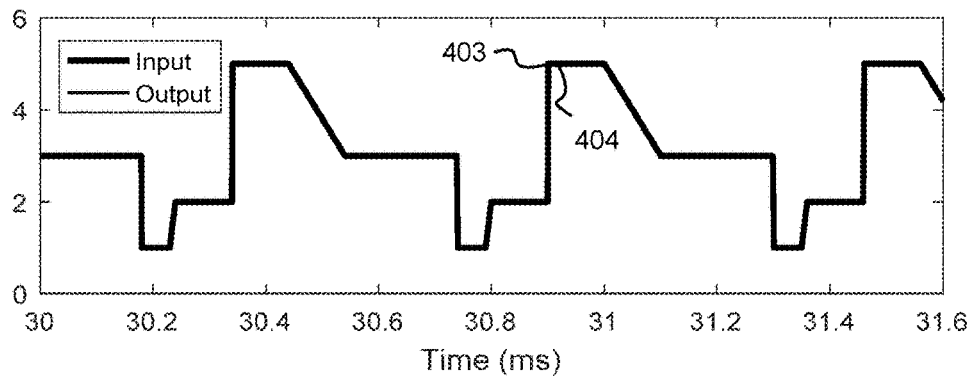
Figure 4C:
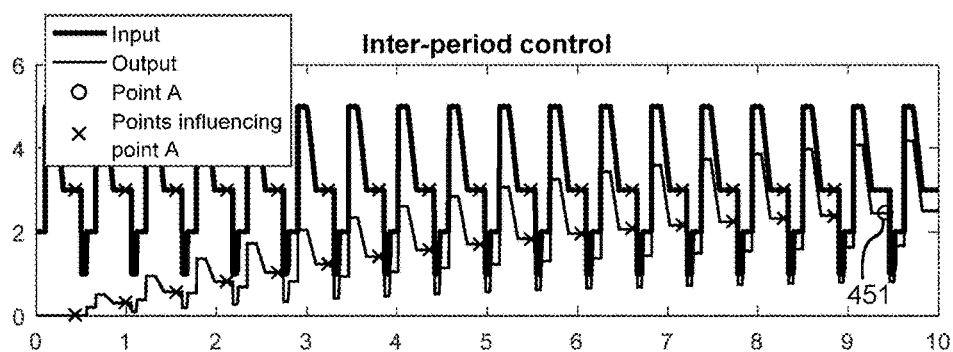
Figure 4D:
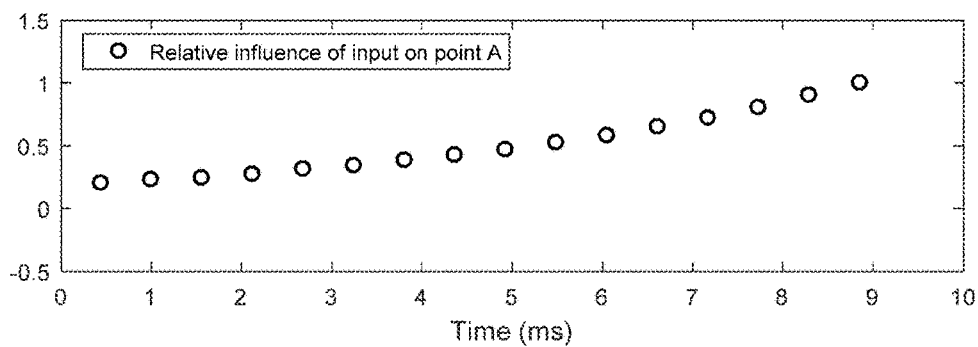

FIGS. 4A-4D show the response of an inter-period controller that may be implemented in a plasma power delivery system according to one embodiment of the present disclosure to a periodic control input. In FIGS. 4A and 4B the response 400 of the output 402 to a periodic input 401 is shown. As shown in the response 400, the output slowly converges to the input (FIG. 4A), but after about 30 cycles of the input (FIG. 4B) the output 404 follows the input 403 with almost imperceptible error. FIG. 4C shows that a point A, 451, on the response 450 and the points that influence point A. Note that for the inter-period controller point A, 451, is still significantly influenced by the input 5 ms in the past. Thus, even though each section of the output approaches the input with a time constant on the order of 5 ms, after a few periods of the input, the output can follow the input with almost imperceptible error. For the conventional intra-period controller, even with a 5 µs time constant, the output does not follow the input with this precision.

Figure 5:
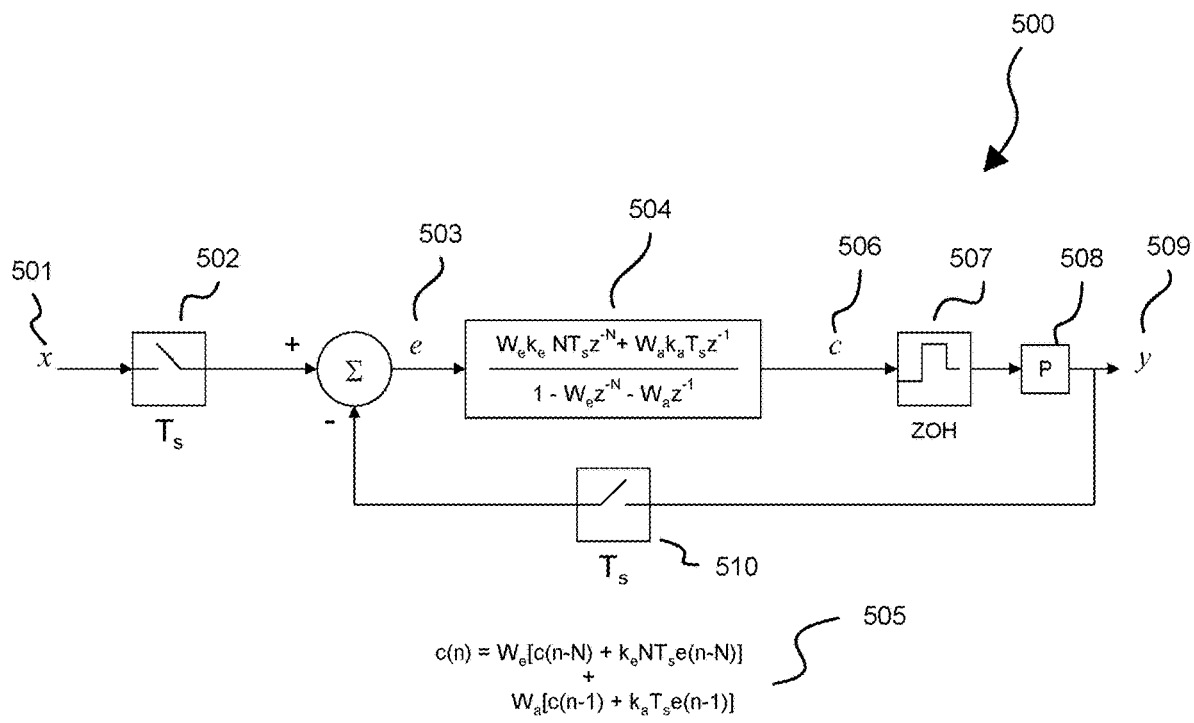
FIG. 5 illustrates a block diagram of an example combined inter-period and intra-period controller that may be implemented in a plasma power delivery system according to one embodiment of the present disclosure.

FIG. 5 illustrates a block diagram of an example combined inter-period and intra-period controller 500 that may be implemented in a plasma power delivery system according to one embodiment of the present disclosure. The input, 501, is sampled and digitized by an analog to digital converter, 502, at a sampling rate of $1/T_s$. (The input may already exist as a data stream in which case the converter 502 is not used.) The output 509 is sampled and digitized by an analog to digital converter 510. (The output may be a digital data stream derived from a measurement of the output in which case the analog to digital converter may not be implemented as shown.) An error function 503 is obtained by subtracting the input from the output. The controller 504 generates the control input to the plant, c, 506, from the values of the control input to the plant, c, 506, and the error function, e, 503, one period of the input, $T_p$, ago and one sampling period, $T_s$, ago. N and $T_s$ are chosen to satisfy $T_p=NT_s$. The control input, c, 506, is a weighted average of a value based on values one sampling period, $T_s$, ago and one period of the input, $T_p$, ago. This weighting is perhaps more clearly illustrated in the sequence (sampled time) domain shown in equation 505. In 504 and 505, $W_e$ is a real number between 0 and 1 and $W_a=1-W_e$. If $W_e=1$, the controller is a pure inter-period controller and if $W_e=0$ the controller is a conventional intra-period controller. The control input to the plant, c, 506, is converted to an analog signal by a digital to analog converter, 507, and applied to a plant, 508. Provision can be made to deal with situations where the repetition period of the input, $T_p$, may vary a few sampling periods. In this case, N is allowed to vary based on the number of sampling periods, $T_s$, that fit in the previous period of the input, $T_p$. In this case, if a section towards the end of the repetition was not recently updated, rather than copying the state from a prior sample, the weighting can be changed to run a pure intra-period controller ($W_e=0$) until the start of the next period of the input. This example combined inter-period and intra-period controller 500 has the additional advantage that it can easily transition from operating with a periodic input to operating with a non-repetitive input, 501.

Figure 6A:
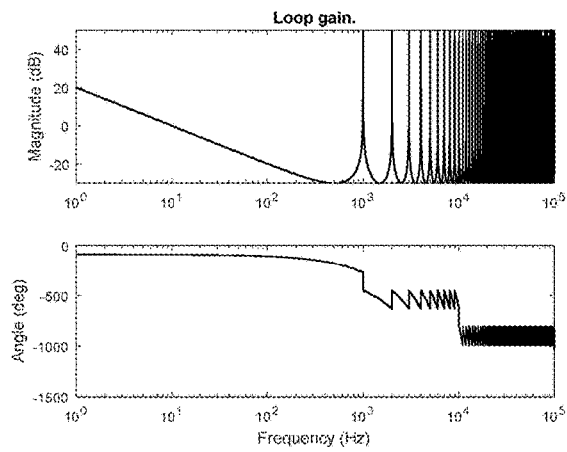
FIG. 6A illustrates the loop gain as a function of frequency of an example pure inter-period controller.
Figure 6B:
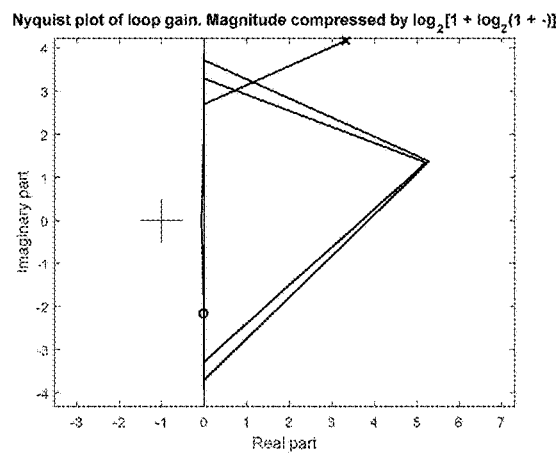
FIG. 6B illustrates the Nyquist plot of the loop gain for the inter-period controller generating the loop gain of FIG. 6A.
Figure 6C:
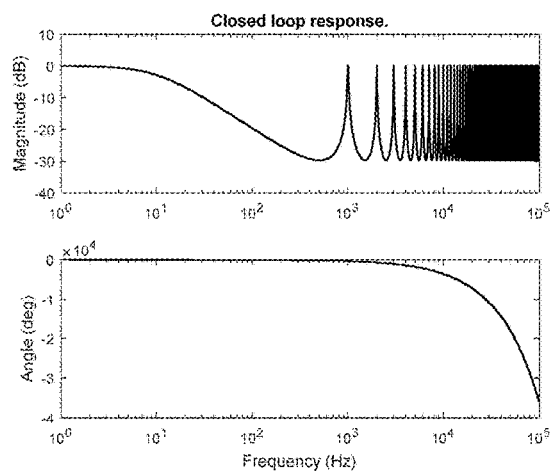
FIG. 6C illustrates the closed loop response as a function of frequency for the inter-period controller generating the loop gain of FIG. 6A.
Figure 6D:
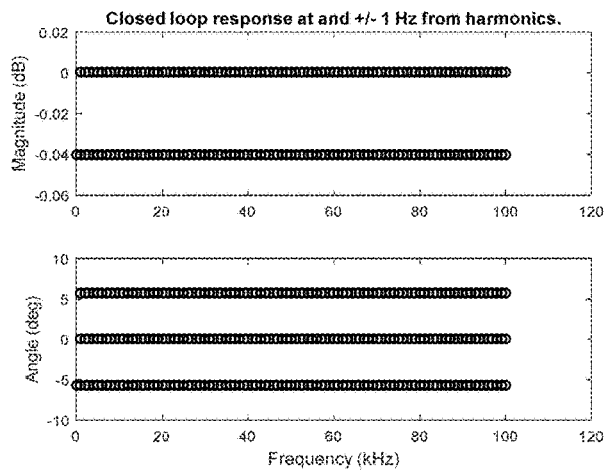
FIG. 6D illustrates the closed loop response as a function of frequency at and close to the harmonics of the input waveform for the pure inter-period controller.

FIG. 6A, FIG. 6B, FIG. 6C and FIG. 6D illustrate properties of an example inter-period controller such as 300, 350 or 500 (with $W_e=1$) that may be implemented in a plasma power delivery system according to one embodiment of the present disclosure. For ease of illustration, in FIG. 6 the plant, P, 308, 357 or 506 is a simple unity gain block, the sample period $T_s=1$ µs, the repetition period $T_p=1$ ms, and hence N=Tp/Ts=1000, and k ($k_e$ in 500)=62.83 The Bode plot of the loop gain of an inter-period controller is shown in FIG. 6A. The loop gain is very different from a traditional intra-period controller. There is a first gain cross over frequency at 10 Hz as may be expected for a gain, k ($k_e$ in 500)=62.83=2π10, but the magnitude of the gain returns to infinity at the harmonics of the input (multiples of $1/T_p$); a unique property of the inter-period controller that allows it to follow a periodic input with unprecedented precision. FIG. 6B shows a Nyquist plot of the loop gain. To facilitate interpretation of the Nyquist plot, the magnitude of the loop gain is scaled by $\log_2(1+\log_2(1+\bullet))$. This mapping maps 0 to 0, 1 to 1 and is monotonically increasing so we can still verify that the point −1+j0 in the complex plane is not encircled. Despite the multiple gain crossings in the Bode plot, the Nyquist plot shows that the system is stable. FIG. 6C shows the magnitude and phase of the closed loop response of the system. FIG. 6D shows the magnitude and phase of the closed loop response of the system only at the harmonics of the input and +/−1 Hz from the harmonics of the input. FIG. 6D shows that the gain at the harmonics is unity gain confirming that a periodic input with period $T_p$ will be followed with precision. In FIG. 6D the points that have exactly 0 dB gain and 0 phase (unity gain) are exactly at the harmonics of the input, points having a gain of −0.04 dB and phase of +/−5 degrees are 1 Hz above and below the harmonic of the input.

Figure 7A:
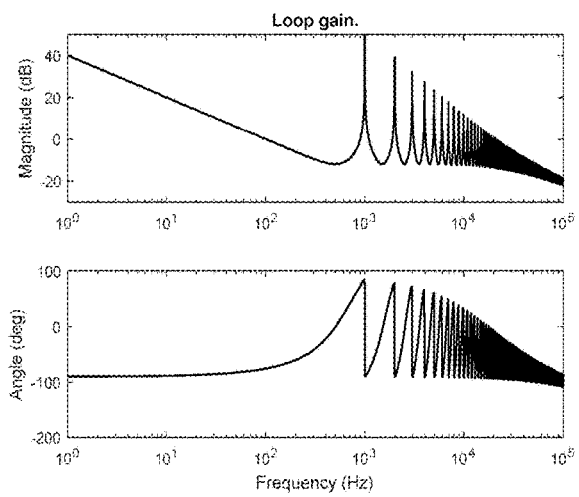
FIG. 7A illustrates the loop gain as a function of frequency of an example combined inter-period and intra-period controller with a 0.1 weighting for the inter-period part and a 0.9 weighting for the intra-period part.
Figure 7B:
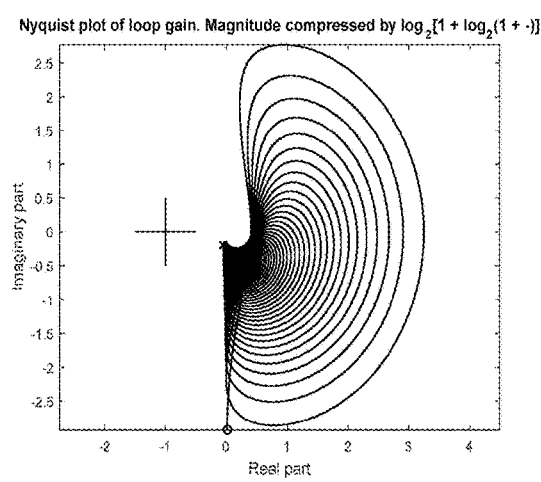
FIG. 7B illustrates the Nyquist plot of the loop gain related to FIG. 7A.
Figure 7C:
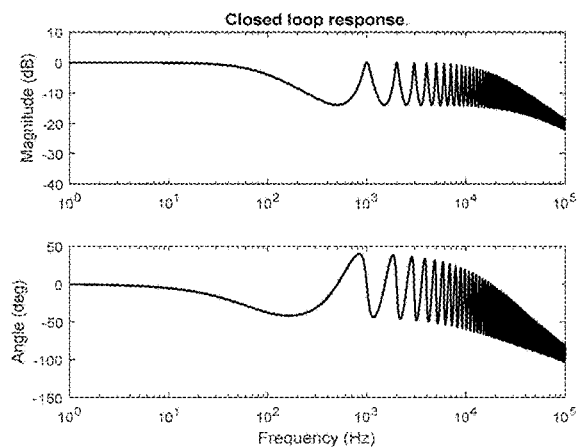
FIG. 7C illustrates the closed loop response as a function of frequency of the example combined controller related to FIG. 7A.
Figure 7D:
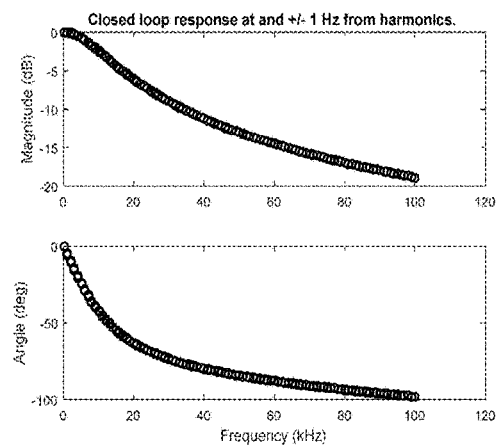
FIG. 7D illustrates the closed loop response as a function of frequency at and close to the harmonics of the input waveform for the combined inter-period and intra-period controller related to FIG. 7A.

FIG. 7A, FIG. 7B, FIG. 7C and FIG. 7D illustrate properties of an example combined inter-period controller and intra-period controller 500 with $W_e=0.1$ that may be implemented in a plasma power delivery system according to one embodiment of the present disclosure. For ease of illustration, in FIG. 7 the plant, P, 506 is a simple unity gain block, the sample period $T_s=1$ µs, the repetition period $T_p=1$ ms, and hence N=Tp/Ts=1000, $k_e=62.83$, and $k_a=62830$. The Bode plot of the loop gain of the combined inter-period and intra-period controller is shown in FIG. 7A. The loop gain is very different from a traditional intra-period controller. There is a first gain cross over frequency at 100 Hz, which is between the cross over frequency for $W_e=1$ of 10 Hz, and the cross over for $W_e=0$ of 10 kHz. The magnitude of the gain returns to high but finite values at the harmonics of the input (multiples of $1/T_p$); a unique property of the combined inter-period and intra-period controller. FIG. 7B shows a Nyquist plot of the loop gain. To facilitate interpretation of the Nyquist plot, the magnitude of the loop gain is scaled by $\log_2(1+\log_2(1+\bullet))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 7C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision.

Figure 8A:
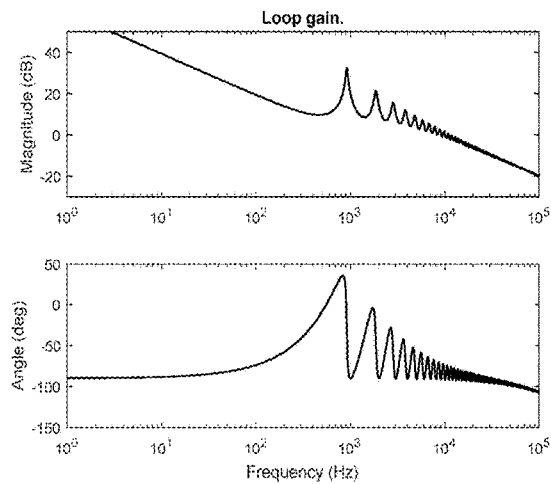
FIG. 8A illustrates the loop gain as a function of frequency of an example combined inter-period and intra-period controller with a 0.01 weighting for the inter-period part and a 0.99 weighting for the intra-period part.
Figure 8B:
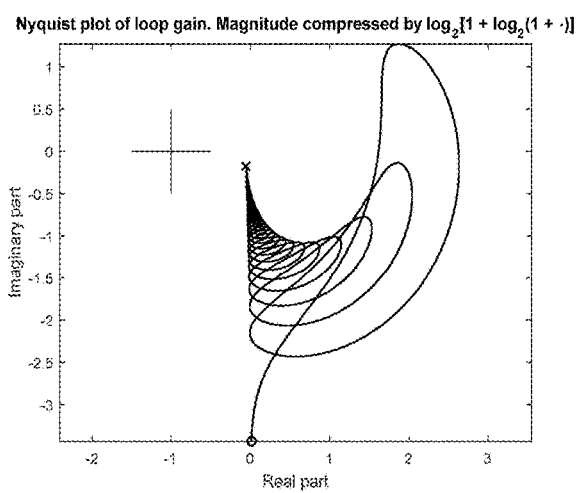
FIG. 8B illustrates the Nyquist plot of the loop gain for the combined controller related to FIG. 8A.
Figure 8C:
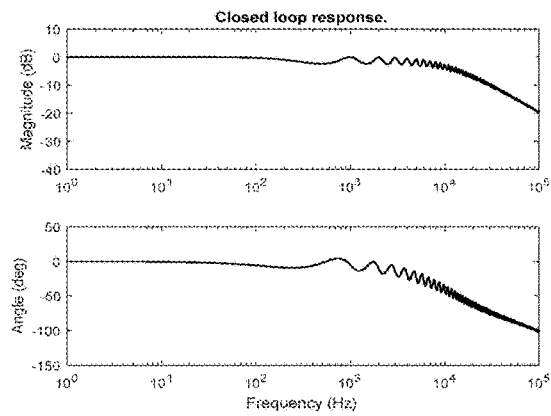
FIG. 8C illustrates the closed loop response as a function of frequency for the combined controller related to FIG. 8A.
Figure 8D:
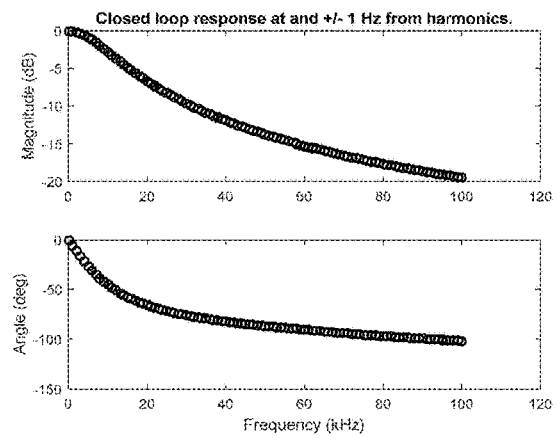
FIG. 8D illustrates the closed loop response as a function of frequency at and close to the harmonics of the input waveform for the same combined inter-period and intra-period controller related to FIG. 8A.

FIG. 8A, FIG. 8B, FIG. 8C and FIG. 8D illustrate properties of an example combined inter-period controller and intra-period controller 500 with $W_e=0.01$ that may be implemented in a plasma power delivery system according to one embodiment of the present disclosure. In FIG. 8 the plant, P, 506 is a simple unity gain block, the sample period $T_s=1$ µs, the repetition period $T_p=1$ ms, and hence N=Tp/Ts=1000, $k_e=62.83$, and $k_a=62830$. The Bode plot of the loop gain of the combined inter-period and intra-period controller is shown in FIG. 8A. The loop gain approaches that of a traditional intra-period controller. There is a first gain cross over frequency at 9.1 kHz, which is between the cross over frequency for $W_e=1$ of 10 Hz, and the cross over for $W_e=0$ of 10 kHz. The magnitude of the gain returns to values higher than unity two more times as the frequency increases. FIG. 8B shows a Nyquist plot of the loop gain. To facilitate interpretation of the Nyquist plot, the magnitude of the loop gain is scaled by $\log_2(1+\log_2(1+))$. This mapping maps 0 to 0, 1 to 1 and is monotonic increasing so we can still verify that the point −1+j0 in the complex plane is not encircled. Despite the multiple gain crossings in the Bode plot, the Nyquist plot shows that the system is stable. FIG. 8C shows the magnitude and phase of the closed loop response of the system. FIG. 7D shows the magnitude and phase of the closed loop response of the system only at the harmonics of the input and +/−1 Hz from the harmonics of the input. FIG. 7D shows that the gain at the first few harmonics of the input is close to unity gain showing that the first few harmonic components of the input will be followed with good precision. This controller approaches the performance of an intra-period controller with a gain cross over frequency of 10 kHz.

Figure 9:
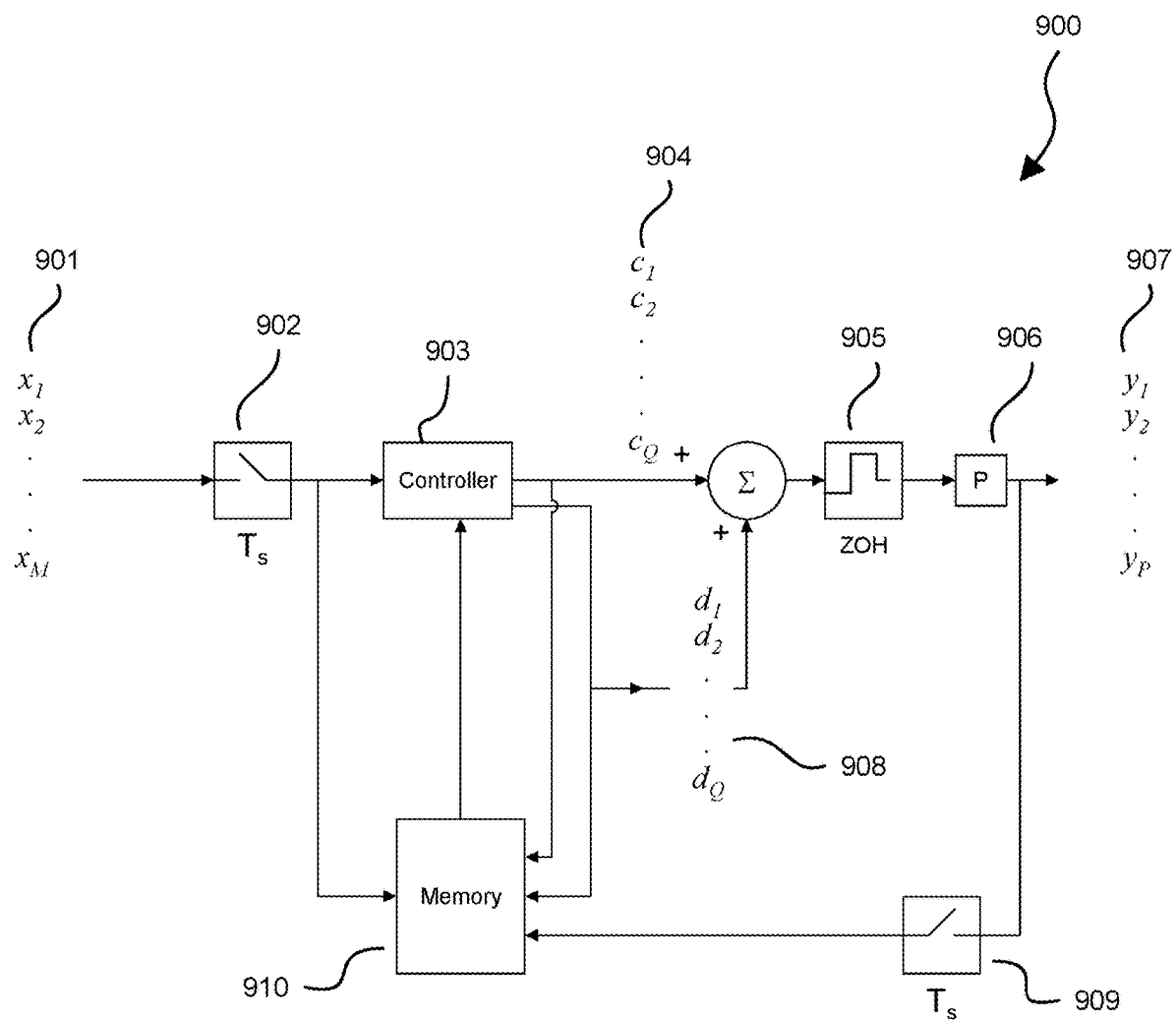
FIG. 9 illustrates a block diagram of a multi-input multi-output version of a combined inter-period and intra-period controller according to one embodiment of the present disclosure.

FIG. 9 illustrates a block diagram of a multi-input multi-output version of an example combined inter-period and intra-period controller 900 that may be implemented in a plasma power delivery system according to one embodiment of the present disclosure. The input, 901, is sampled and digitized by analog to digital converters, 902, at a sampling rate of $1/T_s$. (The input may already exist as a data stream in which case the converters 902 are not used.) The input is multi-dimensional and may, for example, contain inputs for output power and generator source impedance. The output 907 is sampled and digitized by analog to digital converters 909. (The output may be a digital data stream derived from a measurement of the output in which case the analog to digital converters may not be implemented as shown). The output is multi-dimensional and may, for example, include measurements of output power and impedance presented to the generator. The dimensionality of the input 901 and output 907 do not have to agree. This is so because an element of the output may contain a measure of something that is being minimized or maximized and thus does not require an input (e.g., the mismatch of the load impedance presented to the generator to a desired load impedance). Also, an element of the input may not require a corresponding measurement if the value can simply be set and does not require a corresponding measurement (e.g., setting the generator source impedance). Measurements of the input 901, control input 904, perturbation 908, and output 907 are stored in a memory 910. The controller 903 generates the control input to the plant, c, 904, from the values stored in memory, one period of the input, $T_p$, ago and one sampling period, $T_s$, ago. N and $T_s$ are chosen to satisfy $T_p=NT_s$. In some embodiments, the plant 906 can include the generator and the match network (i.e., the summation may produce two distinct control signals that are both passed through the digital to analog converters 905).

In addition to calculating values of the control input to the plant, 904, the controller can also generate a perturbation 908 that is added to the calculated control. The control input 904 to the plant added to the perturbation 908 is converted to an analog signals by digital to analog converters, 905, and applied to a plant, 906. Perturbations 908 can be used to extract correlations between the control input 904 and output 907. For example perturbing the control element in 904 that primarily controls output power (e.g. drive level to the generator) and observing the change in both output power and impedance presented to the generator by the plasma load (or match network) and then perturbing the control element that primarily controls the impedance presented to the generator (e.g. generator frequency) and observing both output power and impedance presented to the generator by the plasma load (or match network) allows the controller to extract the correlation between control inputs 904 and outputs 907. If the input is periodically modulated, the correlation between control inputs 904 and outputs 907 are also modulated (assuming the load is nonlinear as is the case for most plasma loads). An inter-period controller can correlate control inputs 904 and outputs 907 for each specific time period in the repetitive input cycle. For example, for $T_p=1$ ms and $T_s=1$ µs, the controller can maintain 1000 matrices correlating 904 with 907 for each of the 1000 time periods in the input. In addition to extracting correlation between elements of the control input 904 and elements of the output 907 for each specific time period, correlation can be extracted between different time periods. For example, the controller can determine how a change in an element of the control input in one time period affects the output in successive time periods.

A simple example illustrates the advantage of knowing these correlations. Consider the decision on how to update a two-dimensional control vector (e.g., drive and frequency) and a two-dimensional output (e.g., output power and load resistance) for the $7^{th}$ time period in the periodic input. Let the desired change in the outputs of the $7^{th}$ time period be:

$$\begin{bmatrix} \Delta y_1(7) \\ \Delta y_2(7) \end{bmatrix}$$

Assuming that through perturbation the correlation between the outputs in the $7^{th}$ time period and the control inputs in the $6^{th}$ and $7^{th}$ time periods are estimated:

$$\begin{bmatrix} \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \\ \frac{\partial y_1(7)}{\partial c_1(7)} & \frac{\partial y_1(7)}{\partial c_2(7)} & \frac{\partial y_1(7)}{\partial c_1(6)} & \frac{\partial y_1(7)}{\partial c_2(6)} \end{bmatrix}$$

It follows that (approximately):

$$\begin{bmatrix} \Delta y_1(7) \\ \Delta y_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix} \begin{bmatrix} \Delta c_1(7) \\ \Delta c_2(7) \end{bmatrix} + \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix}$$

When the inputs for the $7^{th}$ time period need to be adjusted, the changes to the inputs of the $6^{th}$ time period have already been made, thus:

$$\begin{bmatrix} \Delta c_1(6) \\ \Delta c_2(6) \end{bmatrix}$$

is known and it follows that:

$$\begin{bmatrix} \Delta c_1(7) \\ \Delta c_2(7) \end{bmatrix} = \begin{bmatrix} \frac{\partial y_1(7)}{\partial c_1(7)} & \frac{\partial y_1(7)}{\partial c_2(7)} \\ \frac{\partial y_1(7)}{\partial c_1(7)} & \frac{\partial y_1(7)}{\partial c_2(7)} \end{bmatrix}^{-1} \left( \begin{bmatrix} \Delta y_1(7) \\ \Delta y_2(7) \end{bmatrix} - \begin{bmatrix} \frac{\partial y_1(7)}{\partial c_1(6)} & \frac{\partial y_1(7)}{\partial c_2(6)} \\ \frac{\partial y_1(7)}{\partial c_1(6)} & \frac{\partial y_1(7)}{\partial c_2(6)} \end{bmatrix} \begin{bmatrix} \Delta c_1(6) \\ \Delta c_2(6) \end{bmatrix} \right)$$

The simple example uses two inputs to the plant (drive and frequency) and two outputs (output power and load resistance). Output resistance is only one component of load impedance. In a practical application, load impedance that is important, not just the resistive part of load impedance. In such a case a third input would be utilized (e.g., a variable reactance element in a matching network), or optimization techniques could be employed to find the best solution using only two inputs controlling three outputs rather than the simple computations in the example.

Multi-input multi-output control in conjunction with inter-period control allows control of multiple parameters in one control loop. This avoids the problem of interfering control loops which normally necessitates using widely differing speeds for different control loops in the same plasma power delivery system.

Inter-period control allows for a single controller to more readily control multiple generators delivering power to the same plasma system. The data rate for inter-period and intra-period controllers are the same since the control input to the plant is updated at the sampling rate $1/T_s$. However, the intra-period controller needs information from one sampling period $T_s$ earlier to update a current control input to a plant whereas the inter-period controller needs information from one input period $T_p$ earlier to update a control input to a plant. Since in most cases $T_p$ is multiple times longer than $T_s$, it is much easier to get information to and from a controller before that information is needed for the inter-period controller. Inter-period controllers can thus much more readily take interactions between different generators into account to improve overall control of all generators delivering power to the same plasma system.

Figure 10:
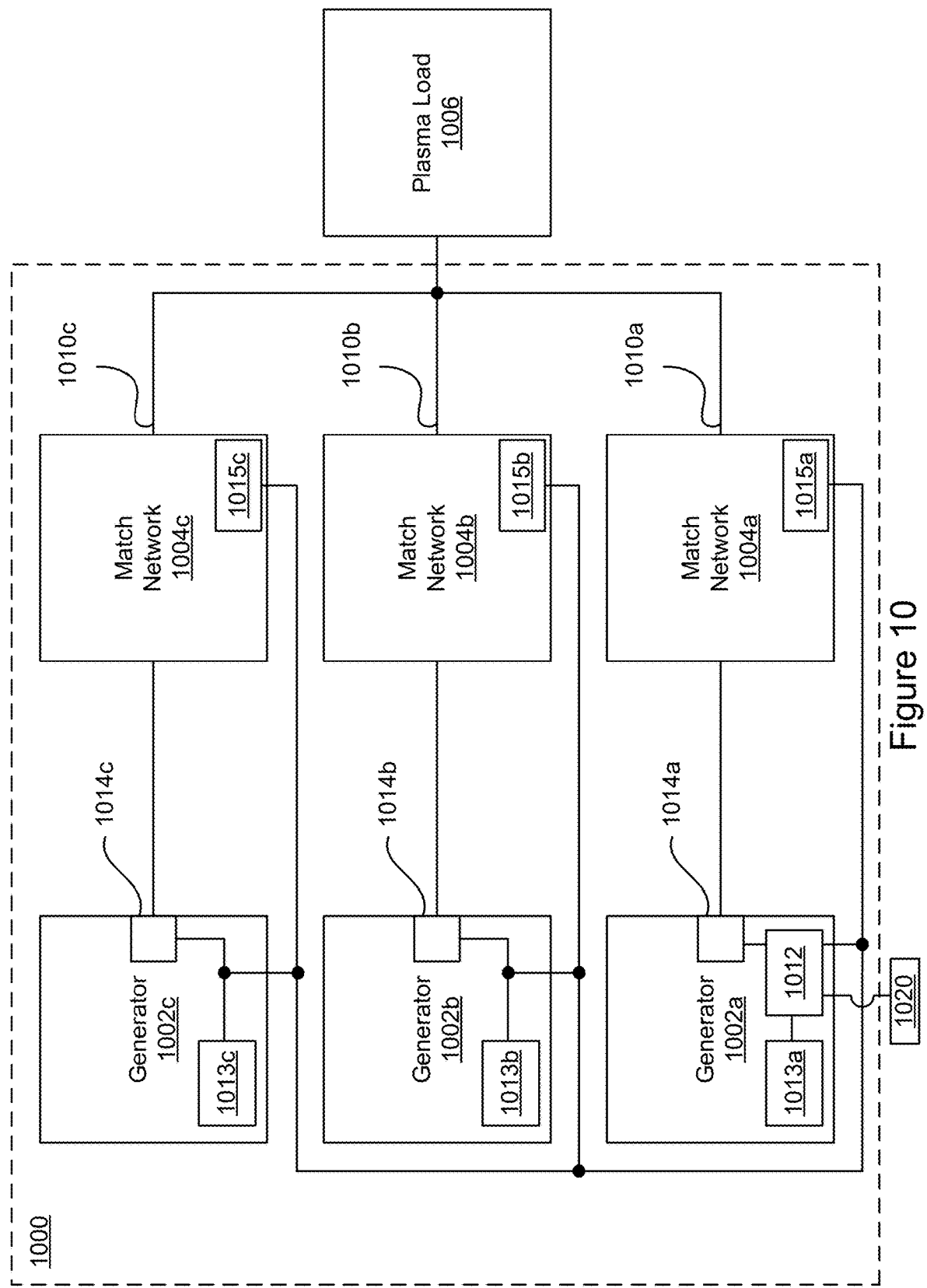
FIG. 10 illustrates an embodiment of a multi-generator power delivery system.

Along these lines, FIG. 10 illustrates an embodiment of a multi-generator power delivery system 1000. The power delivery system 1000 includes three generators 1002a, 1002b, 1002c, such as the plant 906 in FIG. 9, each with a match network 1004a, 1004b, 1004c used to minimize reflected power as the generators 1002a, 1002b, 1002c provide power to a plasma load 1006. A sensor 1014a, 1014b, 1014c is included for monitoring generator 1002a, 1002*b*, 1002*c* voltage, current, phase, impedance, and power. The sensors 1014*a*, 1014*b*, 1014*c* can be part of each generator 1002*a*, 1002*b*, 1002*c* or coupled to each generator 1002*a*, 1002*b*, 1002*c* or external to each generator 1002*a*, 1002*b*, 1002*c*. The sensors 1014*a*, 1014*b*, 1014*c* relay voltage, current, phase, power and impedance measurements to an inter-period controller 1012.

The sensors 1014*a*, 1014*b*, 1014*c* can also relay identifications of themselves including information such as brand, make model, configuration and operating parameters to the inter-period controller 1012. The generators 1002*a*, 1002*b*, 1002*c* and the match networks 1004*a*, 1004*b*, 1004*c* can also identify themselves to the inter-period controller 1012, for instance via the RF engines 1013*a*, 1013*b*, 1013*c* and the impedance control systems 1015*a*, 1015*b*, 1015*c*, respectively.

The inter-period controller 1012 can manage communications between the generators 1002*a*, 1002*b*, 1002*c*, the match networks 1004*a*, 1004*b*, 1004*c*, and the sensors 1014*a*, 1014*b*, 1014*c*. The inter-period controller 1012 is also configured to pass instructions to the generators 1002*a*, 1002*b*, 1002*c* and the match networks 1004*a*, 1004*b*, 1004*c* regarding how and when to adjust internal parameters. In this way the inter-period controller 1012 enables the generators 1002*a*, 1002*b*, 1002*c* and the match networks 1004*a*, 1004*b*, 1004*c* to operate in unison and in a fashion that takes into account variations between components as well as operation of other components. In some instances, this unified operation of the power delivery system 1000 can also consider non-electrical factors such as plasma chamber gas chemistry or processing end point. In an embodiment, a frequency of the generators 1002*a*, 1002*b*, 1002*c* can be tuned while also tuning the match networks 1004*a*, 1004*b*, 1004*c*.

In this multi-generator embodiment, a particular challenge in the art is generating consistent power since each generator 1002*a*, 1002*b*, 1002*c* sees the other generators 1002*a*, 1002*b*, 1002*c* through the transmission mediums 1010*a*, 1010*b*, 1010*c* or the plasma load 1006 (depending on the configuration). In other words, traditional multi-generator systems are plagued by cross talk interaction between the generators 1002*a*, 1002*b*, 1002*c*. By enabling the generators 1002*a*, 1002*b*, 1002*c* and match networks 1004*a*, 1004*b*, 1004*c* to communicate with each other via the inter-period controller 1012 and to be controlled with the inter-period controller 1012 taking into account the operation of all of these components simultaneously, consistent and accurate power can be provided to the plasma load 1006.

In an embodiment, a user can interface with an external controller 1020, which is in communication with the inter-period controller 1012. The external controller 1020 can send and receive both instructions and data to and from the inter-period controller 1112. User control of the generators 1002*a*, 1002*b*, 1002*c* and match networks 1004*a*, 1004*b*, 1004*c* is made via the inter-period controller 1012 by way of the external controller 1020.

While the inter-period controller 1012 is illustrated as being part of generator 1002*a*, it can also be a part of generator 1002*b* or generator 1002*c*. Alternatively, all other locations within the power delivery system 1000 can also be used.

Furthermore, the inter-period controller 1012 can communicate with an RF engine 1013*a*, 1013*b*, 1013*c* of each generator 1002*a*, 1002*b*, 1002*c* and an impedance control system 1015*a*, 1015*b*, 1015*c* of each match network 1004*a*, 1004*b*, 1004*c*. In particular, the inter-period controller 1012 can communicate with and pass instructions to these sub-components. In this way, the inter-period controller 1012 can instruct the generators 1002*a*, 1002*b*, 1002*c* and match networks 1004*a*, 1004*b*, 1004*c* to alter operating parameters such as pulse frequency, power, and variable capacitor position, to name three non-limiting examples.

In some embodiments, the inter-period controller 1012 can be implemented according to any one of the embodiments described relative to FIGS. 3A, 3B, 5, and 9. For instance, the inter-period controller 1012 can compare measured values of the output of the generators 1002*a*, 1002*b*, 1002*c* one or more cycles in the past for a given set point and use the past measured values at the set point to generate a current error signal and consequently a control signal(s) for the RF engines 1013*a*, 1013*b*, 1013*c* and/or the impedance control systems 1015*a*, 1015*b*, 1015*c*. In some implementations of the inter-period controller 1012, the controller can be considered a multi-input-multi-output (MIMO) controller. In particular, the input to the inter-period controller 1012 (e.g., a power delivery setpoint and pulse frequency setpoint) can be a multi-dimensional array and may, for example, contain inputs for output power and generator source impedance. The output can be sampled and digitized by analog and digital converters (the output may be a digital data stream derived from a measurement of the output in which case the analog to digital converters may not be implemented). The output can be multi-dimensional and may, for example, include measurements of output power from the generators 1002*a*, 1002*b*, 1002*c* and impedance presented to the generators 1002*a*, 1002*b*, 1002*c*. The dimensionality of the input and output do not have to agree. In addition to extracting correlation between elements of the control input and elements of the generator output for each specific time period, correlation can be extracted between different time periods. For example, the inter-period controller 1012 can determine how a change in an element of the control input in one time period affects the output in successive time periods.

The inter-period controller 1012 can also be used to impedance match (or tune the generators 1002*a*, 1002*b*, 1002*c* and simultaneously impedance match) using information about an impedance presented to the generators 1002*a*, 1002*b*, 1002*c* and/or values of variable impedance elements in the match networks 1004*a*, 1004*b*, 1004*c* one or multiple periods in the past. These prior impedance measurements can be used to adjust variable impedance elements within the match networks 1004*a*, 1004*b*, 1004*c* at the present time. The information can be used to calculate adjustments to the variable impedance matching elements without first generating an error signal.

The inter-period controller 1012 can obtain an error function by subtracting the inputs to the generators 1002*a*, 1002*b*, 1002*c* from the generator outputs, as measured by the sensors 1014*a*, 1014*b*, 1014*c*. And this error function can be used to generate the control to the RF engines 1013*a*, 1013*b*, 1013*c*.

Figure 11:
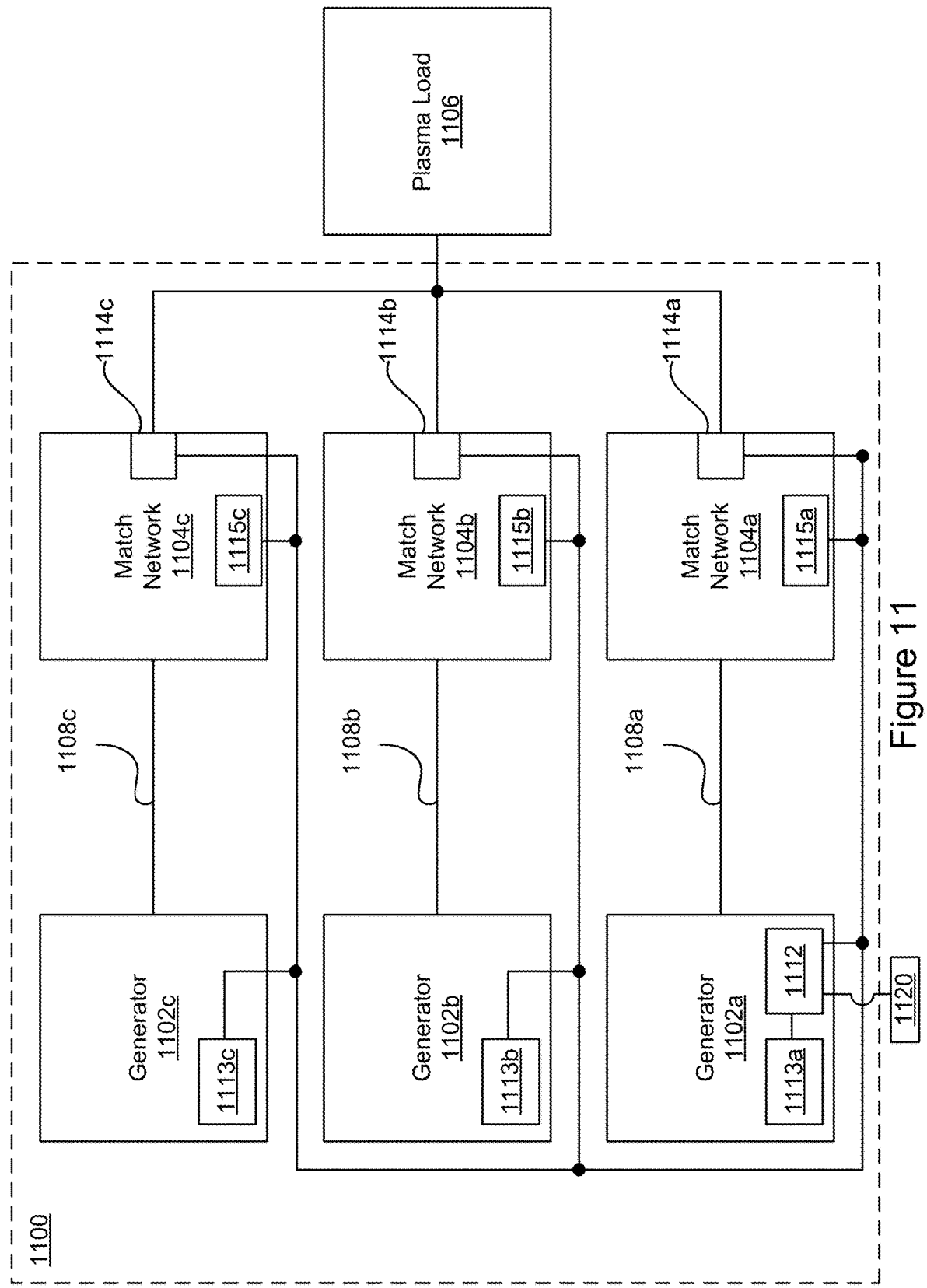
FIG. 11 illustrates another embodiment of a multi-generator power delivery system.

FIG. 11 illustrates another embodiment of a multi-generator power delivery system 1100. FIG. 11 differs from FIG. 10 in that the sensors 1114*a*, 1114*b*, 1114*c* are arranged at outputs of the match network 1104*a*, 1104*b*, 1104*c* instead of at outputs of the generators 1102*a*, 1102*b*, 1102*c*. The sensors 1114*a*, 1114*b*, 1114*c* are configured to characterize the power for each generator 1102*a*, 1102*b*, 1102*c* and match network 1104*a*, 1104*b*, 1104*c* by measuring voltage, current, phase, impedance, and/or power at the output of the match networks 1104*a*, 1104*b*, 1104*c* or en route to the plasma load 1106.

The sensors 1114a, 1114b, 1114c and the generators 1102a, 1102b, 1102c can identify themselves to the inter-period controller 1112 via the RF engines 1113 and the impedance control systems 1115a, 1115b, 1115c, respectively.

The power delivery system 1100 can interface with users via an external controller 1120. The external controller 1120 can be in communication with the inter-period controller 1112 and send and receive both instructions and data to and from the inter-period controller 1112.

As in previous embodiments, the inter-period controller 1112 can be arranged as part of the generator 1102a, as illustrated, or as part of any of the other components within the power delivery system 1100 or adjacent to any of these components, but still within the power delivery system 1100.

While impedance control systems 1115a, 1115b, 1115c are illustrated for each match network 1104a, 1104b, 1104c, one of skill in the art will recognize that these can either represent separate hardware (or software or firmware) components, or a single hardware component comprising a separate logical block for each match network 1104a, 1104b, 1104c. In an alternative embodiment, a single impedance control system (not illustrated) may control operating parameters of all three match networks 1104a, 1104b, 1104c.

In another embodiment, the sensors 1114a, 1114b, 1114c can be replaced by a single sensor located between the match networks 1104a, 1104b, 1104c and the plasma load 1106. The single sensor can measure voltage, current, phase, impedance, and power just as the three sensors 1114a, 1114b, 1114c illustrated are configured to.

Although the generators 1102a, 1102b, 1102c and the match networks 1104a, 1104b, 1104c are illustrated as communicating with the inter-period controller 1112 via the same signal paths (in a bus configuration), in other embodiments, each component may have a separate signal path to the inter-period controller 1112. Alternatively, the generators 1102a, 1102b, 1102c may have one signal path to the inter-period controller 1112 while the match networks 1104a, 1104b, 1104c have another signal path to the inter-period controller 1112. The sensors 1114a, 1114b, 1114c can also have their own signal path to the inter-period controller 1112.

In some embodiments, the inter-period controller 1112 can be implemented according to any one of the embodiments described relative to FIGS. 3A, 3B, 5, and 9. For instance, the inter-period controller 1112 can compare measured values of the output of the match networks 1104a, 1104b, 1104c one or more cycles in the past for a given set point and use the past measured values at the set point to generate a current error signal and consequently a control signal for the RF engines 1113a, 1113b, 1113c and/or the impedance control systems 1115a, 1115b, 1115c. In some implementations of the inter-period controller 1112, the controller can be considered a multi-input-multi-output (MIMO) controller. In particular, the input to the inter-period controller 1112 (e.g., a power delivery setpoint and pulse frequency setpoint) can be a multi-dimensional array and may, for example, contain inputs for output power and generator source impedance. The output can be sampled and digitized by analog and digital converters (the output may be a digital data stream derived from a measurement of the output in which case the analog to digital converters may not be implemented). The output can be multi-dimensional and may, for example, include measurements of output power from the matches 1104a, 1104b, 1104c and match impedance. The dimensionality of the input and output do not have to agree. In addition to extracting correlation between elements of the control input and elements of the match output for each specific time period, correlation can be extracted between different time periods. For example, the inter-period controller 1112 can determine how a change in an element of the control input in one time period affects the output in successive time periods.

The inter-period controller 1112 can also be used to impedance match (or tune the generators 1102a, 1102b, 1102c and simultaneously impedance match) using information about an impedance presented to the generators 1102a, 1102b, 1102c and/or values of variable impedance elements in the match networks 1104a, 1104b, 1104c one or multiple periods in the past. These prior impedance measurements can be used to adjust variable impedance elements within the match networks 1104a, 1104b, 1104c at the present time. The information can be used to calculate adjustments to the variable impedance matching elements without first generating an error signal.

The inter-period controller 1112 can obtain an error function by subtracting the inputs to the generators 1102a, 1102b, 1102c from the match outputs, as measured by the sensors 1114a, 1114b, 1114c at the match outputs. And this error function can be used to generate the control to the RF engines 1113a, 1113b, 1113c.

FIG. 12 illustrates yet another embodiment of a multi-generator power delivery system 1200. FIG. 12 differs from FIGS. 10 and 11 in that the sensors of those figures are replaced here by a single sensor 1214 arranged at an input of the plasma load 1206. The sensor 1214 is configured to characterize the power for each generator 1202a, 1202b, 1202c and match network 1204a, 1204b, 1204c.

The power delivery system 1200 can interface with users via an external controller 1220. The external controller 1220 can be in communication with the inter-period controller 1212 and send and receive both instructions and data to and from the inter-period controller 1212.

Although the generators 1202a, 1202b, 1202c and the match networks 1204a, 1204b, 1204c are illustrated as communicating with the inter-period controller 1212 via the same signal paths (in a bus configuration), in other embodiments, each component may have a separate signal path to the inter-period controller 1212. Alternatively, the generators 1202a, 1202b, 1202c may have one signal path to the inter-period controller 1212 while the match networks 1204a, 1204b, 1204c have another signal path to the inter-period controller 1212. The sensors 1214a, 1214b, 1214c can also have their own signal path to the inter-period controller 1212.

In some embodiments, the inter-period controller 1212 can be implemented according to any one of the embodiments described relative to FIGS. 3A, 3B, 5, and 9. For instance, the inter-period controller 1212 can compare measured values of the output of the match networks 1204a, 1204b, 1204c one or more cycles in the past for a given set point and use the past measured values at the set point to generate a current error signal and consequently a control signal for the RF engines 1213a, 1213b, 1213c and/or the impedance control systems 1215a, 1215b, 1215c. In some implementations of the inter-period controller 1212, the controller can be considered a multi-input-multi-output (MIMO) controller. In particular, the input to the inter-period controller 1212 (e.g., a power delivery setpoint and pulse frequency setpoint) can be a multi-dimensional array and may, for example, contain inputs for output power and generator source impedance. The output can be sampled and digitized by analog and digital converters (the output may be a digital data stream derived from a measurement of the output in which case the analog to digital converters may not be implemented). The output can be multi-dimensional and may, for example, include measurements of summed output power from the match networks 1204a, 1204b, 1204c and plasma load 1206 impedance. The dimensionality of the input and output do not have to agree. In addition to extracting correlation between elements of the control input and elements of the match output for each specific time period, correlation can be extracted between different time periods. For example, the inter-period controller 1212 can determine how a change in an element of the control input in one time period affects the output in successive time periods.

The inter-period controller 1212 can also be used to impedance match (or tune the generators 1202a, 1202b, 1202c and simultaneously impedance match) using information about an impedance presented to the generators 1202a, 1202b, 1202c and/or values of variable impedance elements in the match networks 1204a, 1204b, 1204c one or multiple periods in the past. These prior impedance measurements can be used to adjust variable impedance elements within the match networks 1204a, 1204b, 1204c at the present time. The information can be used to calculate adjustments to the variable impedance matching elements without first generating an error signal.

The inter-period controller 1212 can obtain an error function by subtracting the inputs to the generators 1202a, 1202b, 1202c from the match outputs, as measured by the sensor 1214 at the plasma load 1206 (e.g., at the processing chamber). And this error function can be used to generate the control to the RF engines 1213a, 1213b, 1213c.

While each external controller of FIGS. 10-12 is illustrated as having its own signal path to the local controller, in alternative embodiments, each external controller can share the same signal path used by the sensor generators, and match networks use to communicate with the local controller.

Although the multi-generator embodiments illustrated in FIGS. 10-12 show three sets of generators, match networks, and sensors, in other embodiments, these configurations can be implemented with two or more sets of generators, match networks, and sensors. In one embodiment, there can be a single sensor rather than a sensor for each set of generators and match networks. The single sensor could measure power output locally for one generator and remotely for two generators. The single sensor could also remotely characterize impedance for all three match networks.

In the given examples of inter-period and mixed inter-period and intra-period controllers, the controllers used samples of signals one sampling period, $T_s$, or one repetition period, $T_p$, in the past. Of course, the controller can also use samples of signals multiple sampling periods or repetition periods in the past.

Some advantages of this approach include the ability to provide accurate power regulation over a wide dynamic range, faster power stabilization during transients, and decreased reflected power, for both pulsed and continuous wave (CW) power.

What is claimed is:

1. A power delivery system comprising:
 a generator configured to produce a power signal comprising a periodic repeating pattern produced over a period of time comprising a period of the power signal;
 a sensor configured for arrangement between an input of the generator and an impedance matching network; and
 a controller configured to simultaneously tune the generator and the impedance matching network based on a measurement by the sensor of the periodic repeating pattern and a plurality of correlations between elements of multi-dimensional control input values to elements of multi-dimensional output values.

2. The power delivery system of claim 1, wherein: the controller is configured to control the periodic repeating pattern based on the measurement of the periodic repeating pattern taken in a period prior to a current period combined with a measurement of the periodic repeating pattern during the current period.

3. The power delivery system of claim 1, wherein the generator is configured to produce the periodic repeating pattern with a prescribed pattern wherein the prescribed pattern repeats with a repetition period, and wherein the measurement of the periodic repeating pattern taken in a period prior to a current period occurs one or more repetition periods in the past.

4. The power delivery system of claim 3, wherein the controller is configured to determine and use the plurality of correlations between the elements of the multi-dimensional control input values for a specific time period in the periodic repeating pattern and the elements of the multi-dimensional output values for the specific time period.

5. The power delivery system of claim 4, wherein one element of the periodic repeating pattern is one of voltage, current and power or combinations thereof and another element of the periodic repeating pattern is one of impedance presented to the generator and a source impedance of the generator.

6. The power delivery system of claim 1, wherein the measurement of the periodic repeating pattern by the sensor is taken in a period of the power signal prior to a current period of the periodic repeating pattern.

7. The power delivery system of claim 1, wherein the controller is configured to provide an indication of a start of a pulse of the generator to the sensor before a start of the pulse.

8. The power delivery system of claim 1, wherein the controller is configured to identify one or more of brand, model, serial number, part number, unit type, status, set point and configuration of two or more of the generator, the impedance matching network, and the sensor.

9. A power delivery system comprising:
 a control system; and
 a memory in communication with the control system;
 wherein the control system is configured to:
  produce an output signal that repeats with a repetition period;
  store measurements of the output signal measured by a single sensor arranged between an input to a generator and an impedance match network;
  produce and store a plurality of correlations between elements of multi-dimensional control input values to elements of multi-dimensional output values; and
  control a voltage, current, and phase of the output signal and an impedance seen by the generator based on the plurality of correlations between the elements of multi-dimensional control input values to the elements of multi-dimensional output values.

10. The power delivery system of claim 9, wherein the control system is configured to combine measurements of the output signal taken from one or more previous repetition periods with measurements of the output signal taken from a current repetition period.

11. The power delivery system of claim 9, wherein the control system is configured to produce and use the plurality of correlations between the elements of the multi-dimensional control input values at one time relative to a start of the repetition period and the elements of the multi-dimensional output values at a same time as the start of the repetition period.

12. The power delivery system of claim 9, wherein one of the elements of the multi-dimensional output values comprises at least one of the voltage, the current, and a power of the output signal, wherein another one of the elements of the multi-dimensional output values comprises at least one of a load impedance presented to the generator and a source impedance of the generator.

13. The power delivery system of claim 9, wherein the control system is configured to control the output signal based on stored measurements of the output signal taken from one or more previous repetition periods.

14. The power delivery system of claim 9, wherein the control system is configured to provide an indication of a start of a pulse of the generator to the single sensor before the start of the pulse.

15. The power delivery system of claim 9, wherein the control system is configured to identify two or more of the generator, the impedance match network, and the single sensor.

16. A power control system comprising:
a plasma processing chamber to contain a plasma;
a generator that produces a power signal that modulates plasma properties of the plasma with a periodic modulation pattern that repeats with a repetition period;
an impedance matching network coupled to the plasma processing chamber and the generator;
a sensor configured to monitor the periodic modulation pattern of the power signal; and
control means operably coupled to the sensor, the impedance matching network and the generator, the control means configured to simultaneously tune the impedance matching network and the generator based on the periodic modulation pattern as measured by the sensor and taken one or more repetition periods of the periodic modulation pattern in the past.

17. The power control system of claim 16, wherein the control means comprises means for controlling a variable impedance element in the impedance matching network based on the periodic modulation pattern as measured by the sensor and taken one or more repetition periods of the periodic modulation pattern in the past combined with a measurement of the periodic modulation pattern as measured by the sensor taken less than a repetition period of the periodic modulation pattern in the past.

18. The power control system of claim 16, wherein the control means configured to simultaneously tune the impedance matching network and the generator based on a plurality of correlations between elements of multi-dimensional control input values to elements of multi-dimensional output values.

19. The power control system of claim 16, wherein the control means is configured to simultaneously tune the impedance matching network and the generator based on a measurement indicative of a load impedance taken one or more repetition periods of the periodic modulation pattern in the past.

20. The power control system of claim 16, wherein the control means is configured to identify two or more of the generator, the impedance matching network, and the sensor.

* * * * *